United States Patent [19]
Okino

[11] Patent Number: 5,912,469
[45] Date of Patent: Jun. 15, 1999

[54] CHARGED-PARTICLE-BEAM MICROLITHOGRAPHY APPARATUS

[75] Inventor: Teruaki Okino, Kamakura, Japan

[73] Assignee: Nikon Corporation, Tokyo, Japan

[21] Appl. No.: 08/893,767

[22] Filed: Jul. 11, 1997

[30] Foreign Application Priority Data

Jul. 11, 1996 [JP] Japan .................................. 8-182049
Jul. 11, 1996 [JP] Japan .................................. 8-182050

[51] Int. Cl.⁶ .................................................. H01J 37/30
[52] U.S. Cl. ............................... 250/492.23; 250/396 R; 250/398
[58] Field of Search ....................... 250/492.23, 492.22, 250/396 R, 398

[56] References Cited

U.S. PATENT DOCUMENTS 5,304,811  4/1994  Yamada et al. ......................... 250/398

*Primary Examiner*—Kiet T. Nguyen
*Attorney, Agent, or Firm*—Klarquist Sparkman Campbell Leigh & Whinston, LLP

[57] ABSTRACT

Apparatus are disclosed for performing microlithography using a charged-particle beam and a mask partitioned into multiple subfields to be transferred sequentially to a sensitive substrate. The apparatus comprise a charged-particle-beam illumination system, a charged-particle-beam projection system, and a beam-characteristics correction system situated between the charged-particle-beam source and the substrate. The beam-characteristics correction system is energizable to serve as either an illumination-characteristics correction means (e.g., a first set of coils situated between the source and the mask) or an imaging-characteristics correction means (a first or second set of coils situated between the mask and the substrate). An apparatus can include both first and second sets of coils (one before the mask, the other after the mask) serving to dynamically correct any variations arising in a transverse parameter (such as a focus, astigmatism, deflection, and rotation) of the charged-particle beam as the beam exposes different transfer subfields on the substrate with respective mask subfields. Thus, the transverse parameter of the beam is constant regardless of how much the beam was deflected to reach any mask subfield relative to any other mask subfield.

26 Claims, 11 Drawing Sheets

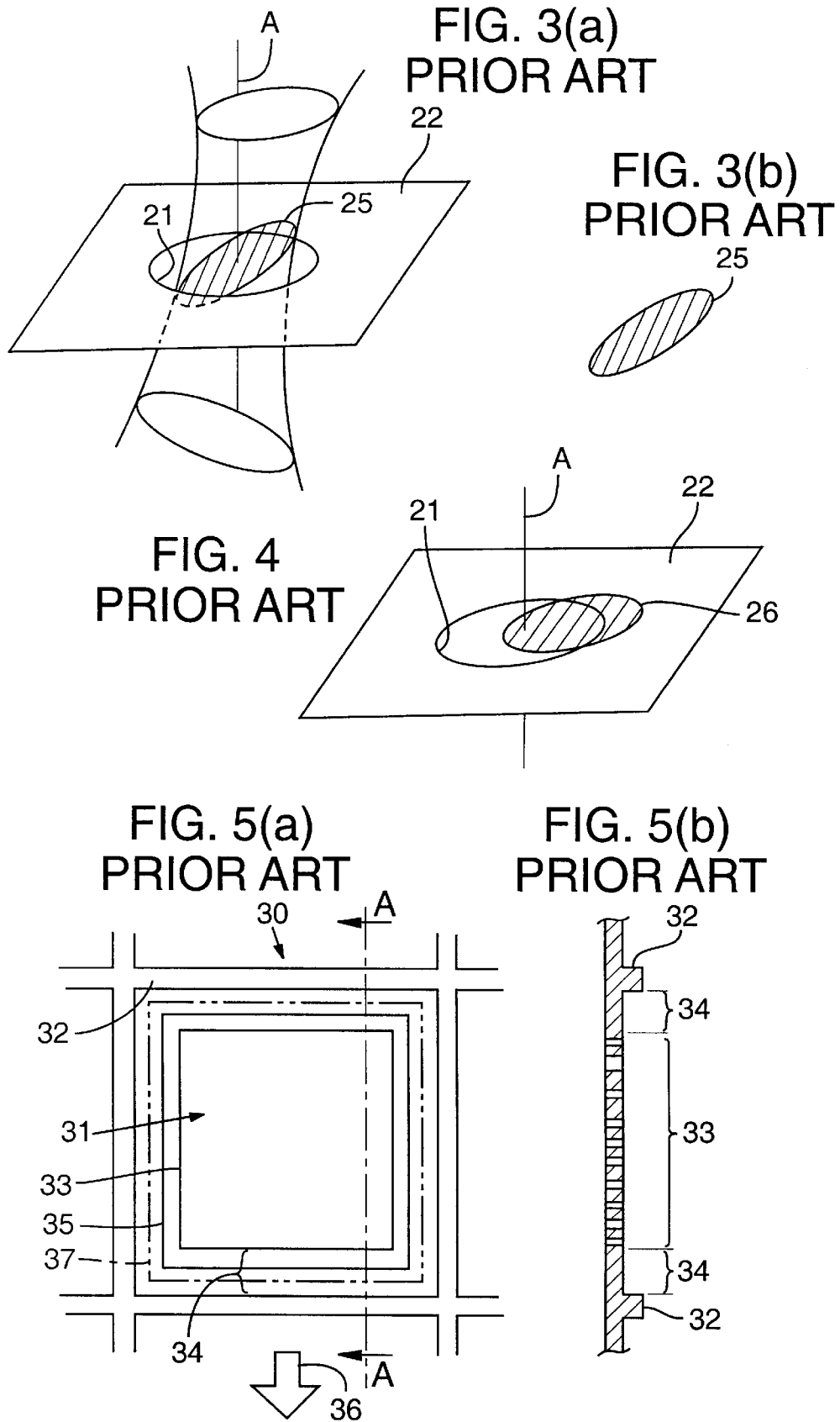

CHARGED-PARTICLE-BEAM MICROLITHOGRAPHY APPARATUS

FIELD OF THE INVENTION

This invention pertains to apparatus used to perform microlithography for manufacturing semiconductor integrated circuits and the like. More specifically, the invention pertains to apparatus that transfer, by a charged-particle beam, a pattern defined by a mask to a sensitive substrate.

BACKGROUND OF THE INVENTION

Much recent research has been dedicated to improving charged-particle-beam projection-exposure apparatus (charged-particle-beam microlithography apparatus) so as to produce an improved resolution of the transferred pattern and improved "throughput" (i.e., productivity). One example of such apparatus includes a "batch-transfer" apparatus, in which an area representing one "die" (i.e., a pattern equivalent to one of several integrated circuits or other devices that are to be formed on a substrate that is sensitive to the charged particles) or an area representing multiple dies is "transferred" (i.e., projection-exposed) from the mask to the sensitive substrate in one exposure. Unfortunately, preparing the necessarily large mask for such an apparatus is difficult. Also, it is difficult to adequately control aberrations in the charged-particle-beam imaging optical system (hereinafter, simply referred to as the "imaging system") of such apparatus below a specified value at any location within the large optical field required to simultaneously expose an entire die or multiple dies.

Charged-particle-beam microlithography apparatus have been developed in which the mask pattern to be transferred to the sensitive substrate is partitioned into multiple "mask subfields" that are each smaller than one die. The partitioned pattern is transferred to the sensitive substrate one subfield at a time to corresponding "transfer subfields" on the substrate. Such apparatus offer better correction of such aberrations such as displacement of the focal point of each subfield or distortion of the transferred image. Thus, exposure of the substrate can be accomplished with better resolution and positional accuracy across an optically wider field than with batch-transfer apparatus.

A conventional charged-particle-beam microlithography apparatus employing, e.g., an electron beam and used with a conventional partitioned mask forms a "crossover image" of the electron-beam source downstream of the mask. If there are no aberrations in the imaging system, the shape of the crossover image is normally circular and the center of the crossover image is normally located on the optical axis of the electron-beam imaging system.

FIG. 1(a) shows an ideal condition of a crossover image 20. The crossover image 20 is formed on the optical axis A inside and concentric with an aperture 21 defined by an aperture stop 22. The crossover image 20 ideally has a circular shape, as shown in FIG. 1(b). (The aperture stop 22 is employed primarily when a so-called scattering mask is used.)

A scattering mask for an electron beam defines the pattern in part with electron-transmitting portions and electron-scattering portions. An electron-transmitting portion is typically a thin film of, e.g., silicon nitride (SiN), and an electron-scattering portion is typically a tungsten film or other suitable metal. The aperture stop 22 blocks extraneous electrons scattered by the scattering mask.

Further with respect to a conventional apparatus, if a mask subfield through which the electron beam is being transmitted is laterally displaced a large distance from the optical axis A, illumination of that particular subfield requires that the electron beam be greatly deflected from the optical axis A. As a result, the path of the electron beam is much different from when the electron beam passes through a mask subfield that is on or much closer to the optical axis A. When a greatly deflected electron beam is focused by the imaging system, aberrations can arise in the crossover image such as defocus and/or astigmatism. Such aberrations can arise even if the crossover image is focused on the optical axis A. An example of such a crossover image 23 is shown in FIG. 2(a). The transverse profile 24 of the electron beam on the aperture 21 of the aperture stop 22 is fuzzy, as shown in FIG. 2(b).

FIG. 3(a) shows a crossover image 25 experiencing astigmatism. With conventional apparatus, whenever it is necessary to impart a large amount of deflection to the electron beam to project a particular mask subfield onto the substrate, the center of the crossover image will tend to be shifted laterally from the optical axis A. Projection of such a crossover image 25 on the aperture 21 can result in the crossover image having an elliptical profile, as shown in FIG. 3(b), even if the crossover image is focused on the optical axis A, as indicated by the crossover image 26 in FIG. 4.

Thus, the amount of the electron beam that actually passes through the aperture 21 can change with a change in the transverse profile of the crossover image accompanying a change in the amount of deflection of the beam from the optical axis required to image a particular sub-field on the mask. This, in turn, causes undesirable changes in the brightness and contrast of the subfield images on the sensitive substrate, which causes decreased dimensional accuracy and resolution of the projected patterns after the sensitive substrate is developed.

Other conventional apparatus lack an aperture stop 22. Such apparatus include several focusing lenses situated within the imaging system. The focusing lenses provide fine adjustment of the focal-point position of the image on the surface of the sensitive substrate, and energization of these lenses is adjusted during focusing. The crossover image is normally positioned at the center of the several focusing lenses along the optical axis. Otherwise, the size of the image or the beam intensity at the exposed surface could change when the focal point is dynamically or statically adjusted by such lenses. However, whenever the position of the crossover image is changed according to the amount of deflection of the electron beam needed to expose a particular mask subfield, the aforementioned conditions are not met and the size of the image and/or the beam intensity at the exposed surface will be changed.

In cases where no special focusing lenses are provided, focusing is accomplished by adjusting the energization of the imaging system itself. However, there are problems in these cases as well with the size of the image and/or the beam intensity at the exposed surface changing when the position of the crossover image changes.

FIG. 5(a) is an enlarged plan view of a portion of a conventional partitioned mask used by a conventional charged-particle-beam microlithography apparatus. The mask 30 is partitioned into multiple mask subfields 31 by struts 32 serving as boundaries forming a two-dimensional grid. Each mask subfield 31 is, e.g., (1 mm)$^2$ in area. FIG. 5(b) is a section along the A—A line of FIG. 5(a), showing that the struts 32 are dimensioned sufficiently to support the weight of the mask 30.

Each mask subfield 31 includes a centered square patterned region 33. The electron beam passes at least through the patterned region 33. A skirt region ("skirt") 34 extends circumferentially between the patterned region 33 and the struts 32. The skirt 34 blocks transmission of the electron beam. An irradiation region 35 (actually irradiated by the electron beam) is larger in area than the patterned region 33, but normally does not extend past the skirt 34. Thus, only the pattern inside the patterned region 33 inside the skirt 34 is transferred to the sensitive substrate. The electron-beam illumination system projects an image of a specific aperture onto the mask 30. The aperture image ideally extends across the irradiation region 35.

In a conventional apparatus employing a partitioned mask, the electron beam is deflected to sequentially transfer a row of mask subfields extending nearly across the optical axis of the optical system in a specific direction. In order to "transfer" (i.e., project an image onto the substrate) the patterned regions in mask subfields in areas perpendicular to the specific direction, the mask and substrate are scanned during exposure by a stage system in a direction perpendicular to the specific direction.

Consequently, since the mask 30 in FIG. 5(a) is intended to be scanned during exposure, e.g., in a direction as indicated by the arrow 36, the irradiation region 35 is typically larger than the patterned region 33 by a specific amount so that the patterned region 33 does not shift away from the irradiation region 35 during transfer.

If the patterned regions of sequential mask subfields are transferred side-by-side onto the substrate, there is a risk of "stitching errors" developing at the boundaries of corresponding transfer subfields on the substrate.

In instances in which, e.g., the irradiation region 35 in FIG. 5(a) is defocused and becomes larger (i.e., now extending to the border 37) the skirt 34 must be widened in advance so as to extend past the border 37. However, since the skirt 34 does not contribute any pattern for transfer, the skirt 34 is a "useless" area that simply enlarges the area of the mask 30 and, consequently, the mask stage, thereby resulting in increased cost. In addition, whenever the shape of the irradiation region 35 changes or undergoes a shift in position, some of the patterned region 33 shifts away from the irradiation region 35, resulting in portions of the pattern on the mask subfield not being transferred to the corresponding transfer subfield on the substrate. Furthermore, whenever the irradiation density varies in certain mask subfields, the intensity of exposure at the corresponding transfer subfields on the sensitive substrate changes accordingly.

Furthermore, if the shape, position, or irradiation density, etc. of the irradiation region 35 changes in a mask subfield 31 that is separated from the optical axis, problems arise because projected images of the patterns in respective mask subfields transferred onto the sensitive substrate can exhibit overlapping transfer-subfield outlines. In efforts to improve the level of integration of semiconductor devices made using charged-particle-beam microlithography apparatus, such seam overlap is a problem. Problems also arise with irregularities in the exposure amount over the area of each die on the sensitive substrate as the result of changes in the shape, etc., of the irradiation region.

SUMMARY OF THE INVENTION

The shortcomings of the prior art summarized above are solved by the present invention that provides, inter alia, a charged-particle-beam microlithography apparatus for transferring a pattern defined by a mask onto a sensitive substrate. The apparatus are used with masks that are partitioned into multiple mask subfields each defining a portion of the pattern. As the pattern portions defined by the mask subfields are transferred to the substrate, the imaging characteristics of the charged-particle beam are maintained constant, regardless of the amount of deflection from the optical axis that is required for the beam to reach any mask subfield.

According to any of several preferred embodiments, the apparatus comprises a charged-particle-beam illumination system, a charged-particle-beam projection system, and a "beam-characteristics correction system" including one or both of an "illumination-characteristics correction system" and an "imaging characteristics correction system".

The charged-particle-beam illumination system comprises a lens (preferably first, second, and third condenser lenses) and a subfield-selection deflector (preferably first and second field-selection deflectors). The charged-particle-beam illumination system serves to selectively direct a charged-particle beam from a charged-particle beam source to a desired mask subfield so as to sequentially expose the mask subfields with the charged-particle beam.

The charged-particle-beam illumination system also preferably comprises an aperture plate that defines an aperture shaped so as to shape the charged-particle beam, passing through the aperture, to form an irradiation region on any mask subfield that encompasses at least a patterned region of the subfield. The image of the aperture (i.e., the transverse profile, etc., of the irradiation field on each mask subfield can be maintained constant by the illumination-characteristics correction system regardless of the amount of deflection of the beam from the optical axis. Consequently, all mask subfields are consistently exposed, even mask subfields that are laterally positioned a relatively long distance from the optical axis. The irradiation region is consistently formed inside a skirt (a non-patterned region surrounding the patterned region of a mask subfield). Because the size and shape of each irradiation region is constant from one mask subfield to the next, the skirt can be made narrower, thereby allowing a reduction in mask size and cost.

The charged-particle-beam projection system is situated downstream along an optical axis from the charged-particle-beam illumination system. The charged-particle-beam projection system receives a portion of the charged-particle beam passing through the selected mask subfield and directs the charged-particle beam to a corresponding transfer subfield on the substrate. The charged-particle-beam projection system preferably comprises a collimation lens, an objective lens, and a deflector (preferably first and second two-stage EM deflectors). As the charged-particle beam passes through the charged-particle-beam projection system, the beam is deflected from the selected mask subfield to a crossover, and from the crossover to the corresponding transfer subfield on the substrate.

The beam-characteristics correction system preferably comprises a first set of coils and optionally a second set of coils. The beam-characteristics correction system is situated between the source and the substrate. For example, the first set of coils can be situated between the source and the mask or between the mask and the substrate. Alternatively, the first set of coils can be situated between the source and the mask and the second set of coils can be situated between the mask and the substrate. Either of the first and second set of coils is energizable to dynamically correct any variations arising in a transverse parameter of the charged-particle beam as the charged-particle beam exposes different transfer subfields on the substrate with respective mask subfields. Consequently, the transverse parameter of the charged-particle beam remains unchanged regardless of the amount of deflection of the charged-particle beam from the optical axis required to reach the selected mask subfield relative to any other mask subfield. Placing any portion of the beam-characteristics correction system between the source and the mask enables the system to correct variations in the transverse parameter arising in the charged-particle-beam illumination system. Placing any portion of the beam-characteristics correction system between the mask and the substrate enables the system to dynamically correct any variations arising in the charged-particle-beam projection system, i.e., in the transverse parameter of the charged-particle beam as the charged-particle beam exposes different transfer subfields on the substrate with respective mask subfields.

The transverse parameter corrected by the beam-characteristics correction system can be any of focus, astigmatism, position relative to the optical axis, transverse shape, rotation, and irradiation density of the charged-particle beam. To such end, the first set of coils, for example, can comprise a coil to correct focal-point displacement, a coil to correct astigmatism, a coil to correct positional alignment, and a coil to correct rotation of the charged-particle beam. The second set of coils can be similarly constituted.

The crossover mentioned above is preferably situated at a location on the optical axis at which a crossover image is formed, by the charged-particle-beam projection system, of the charged-particle-beam source as irradiated through the selected mask subfield. With such a configuration, the first set of coils can serve to correct any variations in the transverse parameter at the crossover. An aperture stop can be placed at the crossover, wherein the aperture defines an axial aperture that transmits the crossover image. The aperture stop is especially advantageous when a scattering mask is used because the stop blocks extraneous scattered charged particles (such as electrons). Since the transverse profile of the crossover image is maintained constant by the beam-characteristics correction system, the current of charged particles in the beam passing through the aperture remains constant from one exposure to the next. This ensures a constant brightness and/or contrast of the images formed on the transfer subfields relative to one another.

The first set of coils and, if present, the second set of coils can comprise either or both of an electromagnetic compensator coil and an electrostatic compensator coil. The coil to correct focal-point displacement preferably lacks a core. The coil to correct astigmatism preferably comprises eight electromagnetic saddle coils arranged equiangularly around the optical axis, wherein opposing magnetic fields are generated between opposing pairs of the saddle coils. The coil to correct positional alignment preferably comprises four electromagnetic saddle coils arranged equiangularly around the optical axis, wherein same-directional magnetic fields are generated between opposing pairs of the saddle coils.

An apparatus according to the invention also preferably includes a main controller connected to the beam-characteristics correction system via a deflection-correction regulator. The main controller is also preferably connected to the subfield-selection deflector and the deflector in the charged-particle-beam projection system. The main controller determines, inter alia, an amount of required deflection of the charged-particle beam by the subfield-selection deflector and the deflector in the charged-particle-beam projection system. The main controller is also operable to determine an amount of dynamic correction required of the transverse parameter by the beam-characteristics correction system, depending upon the particular mask subfield being exposed.

As stated above, an apparatus according to the invention can include an aperture plate (defining an aperture) situated between the charged-particle-beam source and the mask. The aperture is preferably dimensioned to shape the charged-particle beam for forming an irradiation region on the selected mask subfield. The beam-characteristics correction system maintains a constant profile of the irradiation region regardless of the amount of deflection of the charged-particle beam from the optical axis for the charged-particle beam to reach any selected mask subfield. The aperture plate can be coplanar with a plane that is conjugate with the mask, or displaced from a plane that is conjugate with the mask (the latter for performing "half-shadow overlay" exposure).

In the half-shadow overlay method of exposure, the irradiation region has a border and an intensity distribution that is constant in central regions of the irradiation region and decreases to zero linearly (or nearly linearly) across the border. Thus, the distribution of irradiation energy across the irradiation region is trapezoidal (or nearly trapezoidal). As a result, regions of the irradiation region exhibiting a linear decrease of irradiation energy define half-shadow regions. The charged-particle-beam projection system projects successive mask subfields on the substrate such that, with respect to corresponding transfer subfields, the half-shadow region of each transfer subfield overlaps the half-shadow region of an adjacent transfer subfield.

The foregoing and additional features and advantages of the invention will be more readily apparent from the following detailed description that proceeds with reference to the accompanying drawings.

BRIEF DESCRIPTION OF THE DRAWINGS

FIG. 3(a) schematically shows a crossover image experiencing astigmatism from being greatly deflected relative to the optical axis A by a prior-art electron-beam microlithography apparatus.

FIG. 3(b) shows the transverse profile of the crossover image of FIG. 3(a).

FIG. 4 schematically shows the crossover image of FIG. 3(a) focused on the optical axis A, as obtained by a prior-art electron-beam microlithography apparatus.

FIG. 5(a) is an enlarged plan view of a portion of a conventional partitioned mask used by a prior-art electron-beam microlithography apparatus.

FIG. 5(b) is a section of FIG. 5(a) along the line A—A.

DETAILED DESCRIPTION

The invention is described fully by reference to a number of example embodiments.

Example Embodiment 1

This example embodiment is described in connection with FIGS. 6–7, 8(a)–8(b), 9, and 10(a)–10(b), depicting various features of a "reducing" (i.e., demagnifying) charged-particle-beam microlithography apparatus 40 employing a partitioned mask and comprising a symmetric magnetic doublet-type imaging system. The apparatus is termed "reducing" because the image produced on the substrate by projection-exposure is demagnified, i.e., smaller than the corresponding mask pattern from which the exposure was made.

Figure 1A:
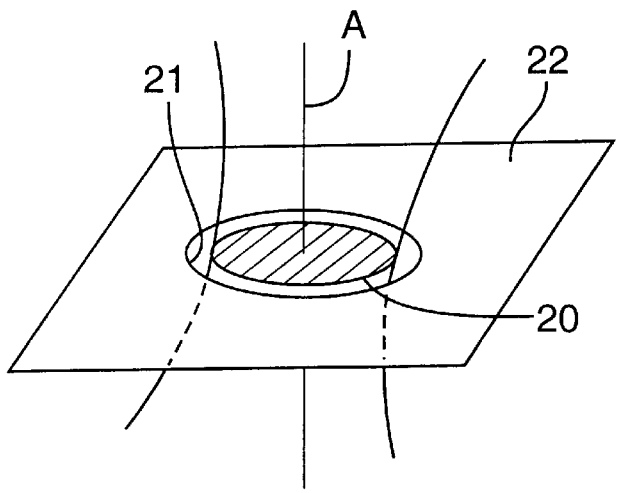
FIG. 1(a) schematically depicts an ideal relationship of a crossover image on an optical axis A of a charged particle beam relative to an aperture defined by an aperture stop.
Figure 1B:
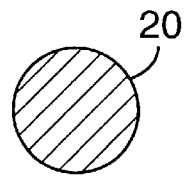
FIG. 1(b) shows the ideal transverse circular profile of the crossover image of FIG. 1(a).
Figure 2A:
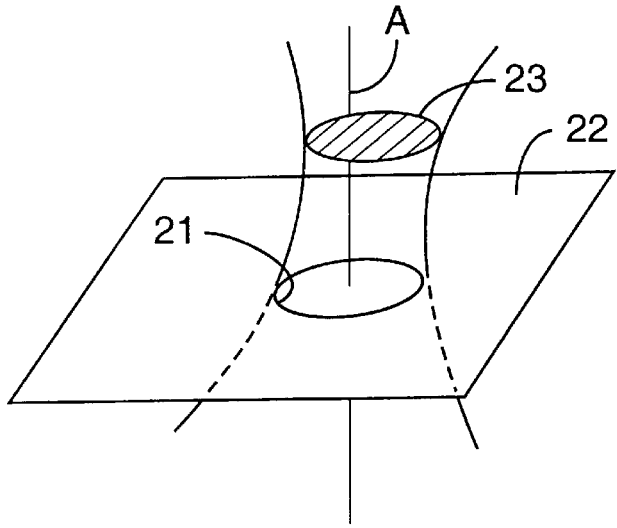
FIG. 2(a) schematically depicts a crossover image exhibiting abberation from being greatly deflected relative to the optical axis A by a prior-art electron-beam microlithography apparatus.
Figure 2B:
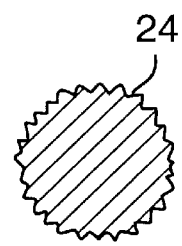
FIG. 2(b) shows the transverse profile of the crossover image of FIG. 2(a).
Figure 6:
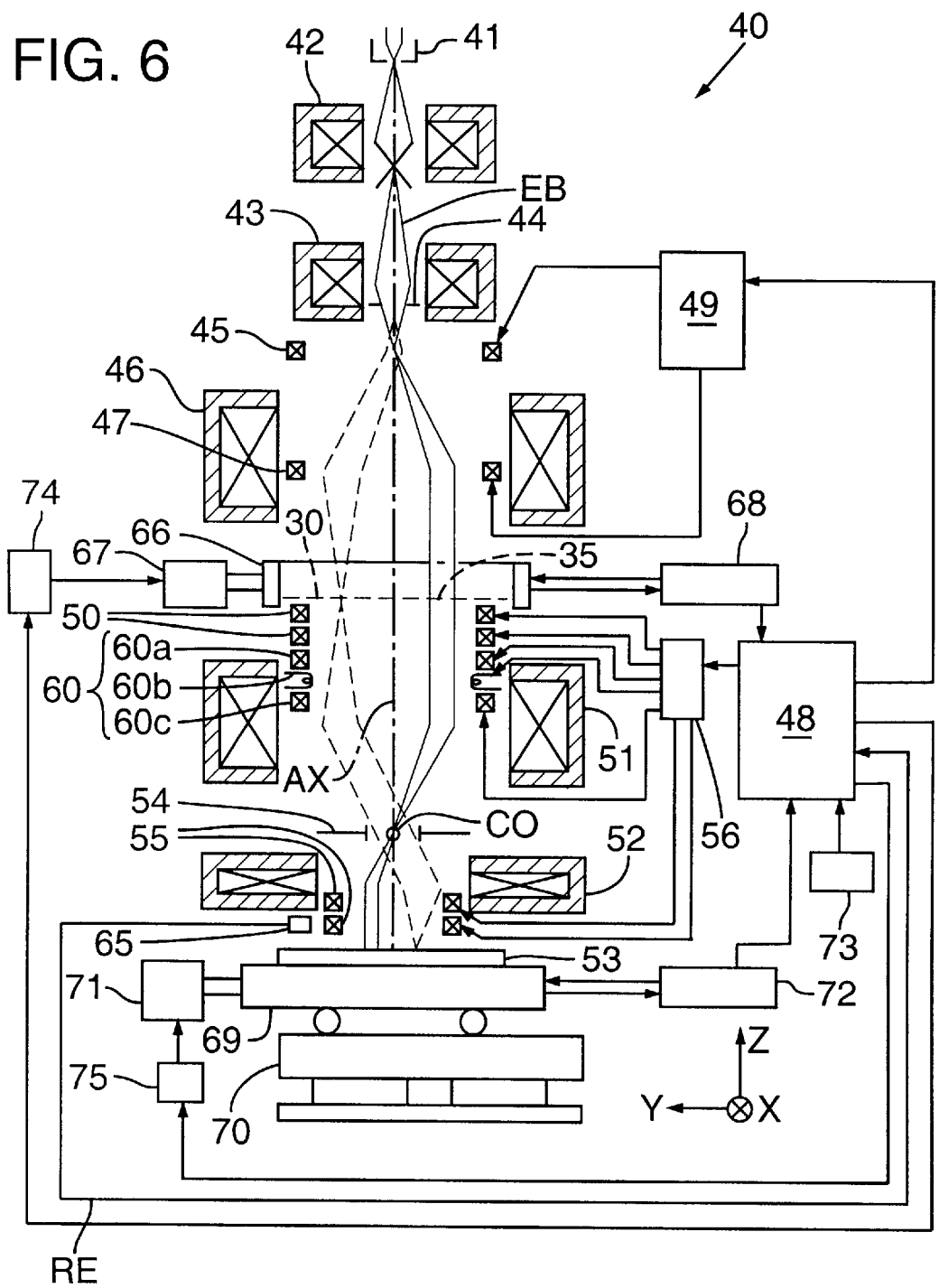
FIG. 6 is a schematic elevational diagram of a charged particle beam microlithography apparatus according to Example Embodiment 1.

The overall apparatus 40 is depicted schematically in FIG. 6 in which the Z axis is parallel to the optical axis AX of the electron optical system, the X axis is perpendicular to the plane of the page, and the Y axis is parallel to the plane of the page but perpendicular to the Z axis.

As a representative charged-particle beam, an electron beam EB is emitted from an electron gun 41. The electron beam EB is focused by a first condenser lens 42, then by a second condenser lens 43. An aperture plate 44 is situated in proximity to the second condenser lens 43. The electron beam EB passes through an aperture defined by the aperture plate 44 and is deflected primarily in the Y direction by a first subfield-selection deflector 45. The electron beam EB is then made into a parallel beam by a third condenser lens 46 and deflected back by a second subfield-selection deflector 47 to an irradiation region 35 of a subfield on the mask 30. The subfield-selection deflectors 45, 47 are preferably electromagnetic deflectors exhibiting amounts of deflection that are controlled by a main controller 48 via a deflection regulator 49. The main controller 48 also controls the overall operation of the apparatus 40.

In FIG. 6, the path of the electron beam EB indicated by the solid lines shows the conjugate relationship of the crossover image, while the path indicated by the dashed lines shows the conjugate relationship of the mask-pattern image.

In this example embodiment, the plane in which the aperture plate 44 is situated is conjugate with the plane in which the mask 30 is situated, so that the projected image of the aperture of the aperture plate 44 is the irradiation region 35 on the mask 30.

After the electron beam EB passes through the mask 30, the beam is deflected by a specified amount by deflectors 50 that collectively comprise a first two-stage electromagnetic deflector. The beam is then formed into a crossover image CO by a collimation lens 51 and focused by an objective lens 52 onto a substrate 53 coated with a suitable electron-beam resist. Thus, an image, demagnified by a specified demagnification ratio β (e.g., ¼), of the pattern inside one subfield on the mask 30 is transferred to a corresponding transfer subfield on the substrate 53.

The collimation lens 51 and objective lens 52 in this example embodiment comprise a symmetric magnetic doublet (SMD)-type imaging system. An aperture stop 54 is situated where the crossover image CO is formed. Deflectors 55, collectively comprising a second two-stage electromagnetic deflector, are situated between the objective lens 52 and the substrate 53.

The amount of deflection imparted by the deflectors 50, 55 is set by the main controller 48 connected to the deflectors 50, 55 via a deflection-correction regulator 56. Since the various subfields on the mask 30 are flanked by struts, the deflectors 50, 55 are used to laterally shift the electron beam a distance sufficient to eliminate imaging the struts on the substrate 53 and place the transfer subfields on the substrate 53 properly adjacent one another.

The FIG. 6 embodiment also includes an imaging-characteristic-correction system 60 for correcting imaging characteristics such as displacement of the focal point, astigmatism, and positional shift of the crossover image CO. The imaging-characteristic-correction system is situated in this example embodiment upstream of the crossover image CO. The imaging-characteristic-correction system 60 comprises a focus-correction coil 60a, an astigmatism-correction coil 60b, and an and an alignment coil 60c.

The focus-correction coil 60a preferably lacks a core and corrects the focal-point position (position in the Z direction) of the crossover image CO. Alternatively, the focal-point position can be corrected using an electrostatic lens.

Figure 8A:
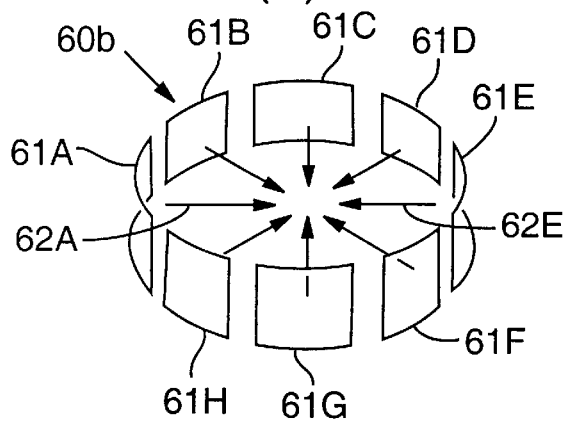
FIG. 8(a) schematically depicts a preferred embodiment of an astigmatism-correction coil as used in the imaging-characteristics-correction system of Example Embodiment 1.

The astigmatism-correction coil 60b, as shown in FIG. 8(a), preferably comprises eight electromagnetic saddle coils 61A–61H are arranged at equal angles around the optical axis. Opposing magnetic fields are generated between each pair of facing saddle coils. E.g., opposing magnetic fields are generated between facing saddle coils 61A and 61E, as indicated by arrows 62A and 62E; similar opposing magnetic fields are generated between the other facing saddle coils. An electrostatic astigmatism compensator can be used instead of the electromagnetic astigmatism correction coil 60b.

Figure 8B:
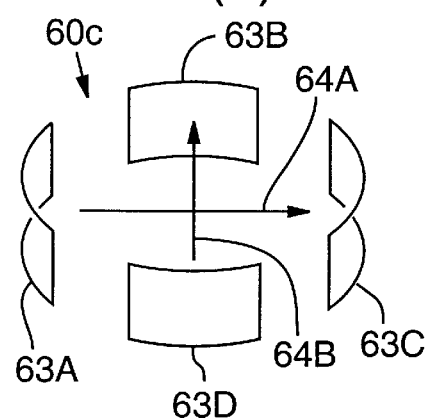
FIG. 8(b) schematically depicts a preferred embodiment of an alignment-correction coil as used in the imaging-characteristics-correction system of Example Embodiment 1.

The alignment coil 60c, as shown in FIG. 8(b), preferably comprises a tetrode array of electromagnetic saddle coils 63A–63D situated at equal angles around the optical axis. A magnetic field is generated between each set of opposing coils. For example, a magnetic field is generated between facing coils 63A and 63C, as indicated by the arrow 64A, and a magnetic field (arrow 64B) is produced between the other pair of facing coils 63B, 63D. The position of the crossover image CO can be corrected in the X and Y directions by the alignment coil 60c. As an alternative to the electromagnetic coils 63A–63D, an electrostatic deflector can be used for correcting X-Y alignment.

The amounts of correction imparted by the focus-correction coils, astigmatism-correction coils, and alignment coils for each subfield of the mask 30 can be set by the main controller 48 via the deflection-correction regulator 49.

A backscattered-electron detector 65 is preferably situated immediately downstream of the objective lens 52 so as to detect electrons from the substrate 53. The backscattered-electron detector 65 produces a signal RE that is routed to the main controller 48.

The mask 30 is mounted on a mask stage 66 parallel with the XY plane. The mask stage 66 is movable continuously in the X direction, and step-wise in the Y direction, by an actuator 67. The position of the mask stage 66 in the XY plane is detected by a laser interferometer 68 that outputs data to the main controller 48.

The substrate 53 is held on a substrate stage 69 mounted on a specimen base 70 parallel with the XY plane. In the X-Y directions, the substrate stage 69 is movable by an actuator 71 continuously in the X direction in a direction opposite the direction in which the mask stage 66 is moved, and can be moved step-wise in the Y direction. The substrate stage 69 is moved in the opposite direction, in the X dimension, from the movement of the mask stage 66 because the mask-pattern image is inverted by the lenses 51, 52. The position of the substrate stage 69 in the XY plane is detected by a laser interferometer 72 that outputs data to the main controller 48.

The main controller 48 calculates the amount of required deflection of the electron beam EB by the subfield-selection deflectors 45, 47 and the deflectors 50, 55. The main controller 48 also calculates information required to control movement of the mask stage 66 and the substrate stage 69 (e.g., the position and movement velocity of each) based on exposure data produced by a data-input device 73 (e.g., keyboard, mouse, touchscreen or other suitable data-entry device) and on position data for the mask stage 66 and substrate stage 69 detected by the respective laser interferometers 68, 72. The calculated information concerning deflection amount is output from the main controller 48 to the deflection regulator 49 and the deflection-correction regulator 56. These regulators set the amount of deflection effected by each of the subfield-selection deflectors 45, 47 and the deflectors 50, 55. In addition, by appropriately driving the imaging-characteristics correction system 60 by the deflection-correction regulator 56 to produce a desired amount of deflection of the electron beam EB from the optical axis AX, displacement of the focal point, astigmatism, and positional shift of the crossover image CO can be controlled so as not to exceed specified tolerances.

The calculation results regarding movement of the mask stage 66 and the substrate stage 69 are output to respective drivers 74 and 75. These drivers 74, 75 control the operation of the actuators 67 and 71, respectively, so that the stages 66, 69 operate according to the calculation results.

As indicated above, the main controller 48 can be provided with an appropriate data-input device 73. For example, the data-input device 73 can be operable to read magnetically recorded information, or operable to read exposure data that have been pre-registered on the mask 30 or substrate 53.

Figure 7:
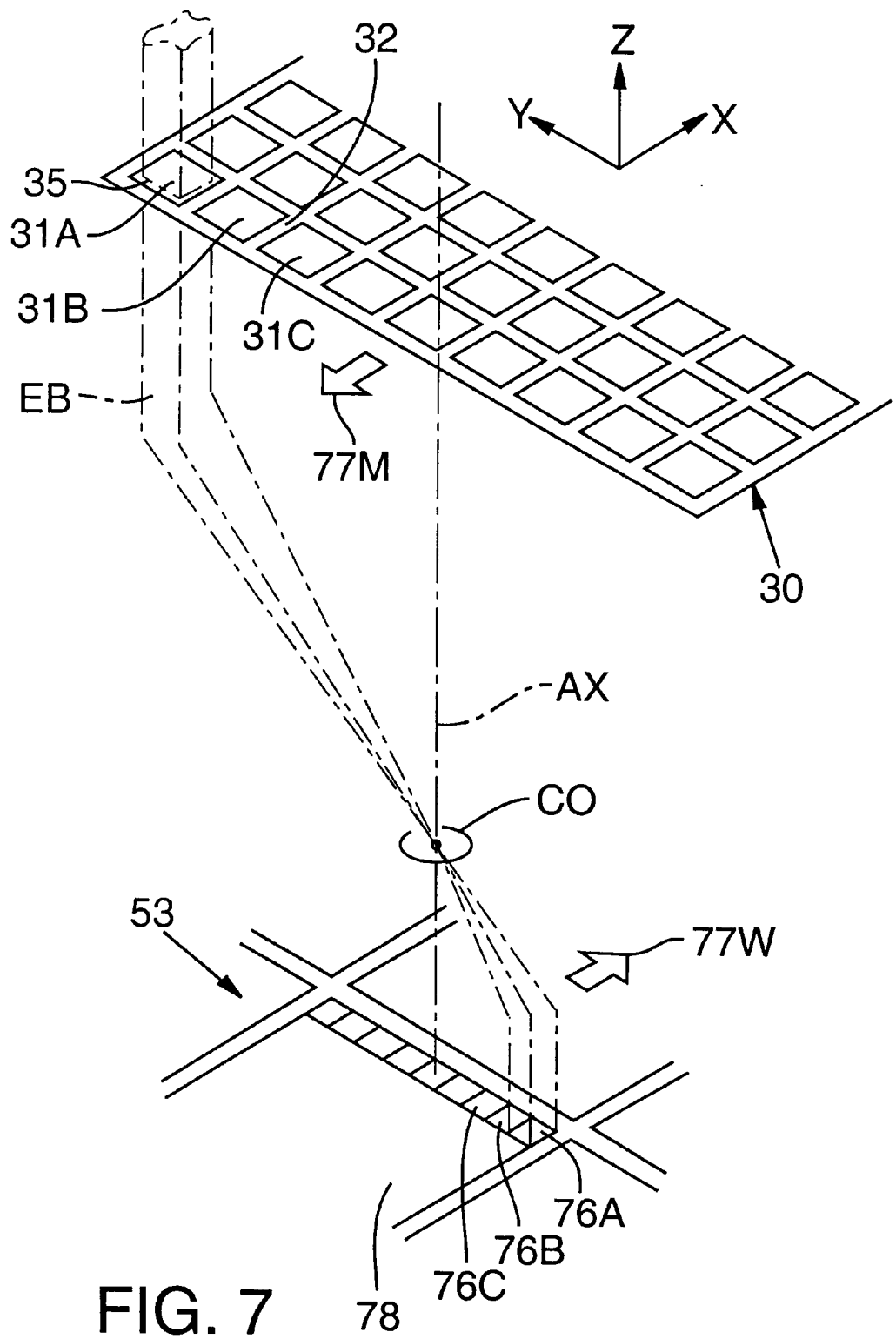
FIG. 7 schematically illustrates the arrangement of subfields on the mask and the arrangement of corresponding transfer subfields on the substrate, as projected by an apparatus such as that in FIG. 6.

The arrangement of subfields on the mask 30 and the corresponding arrangement of transfer subfields on the substrate 53 are now explained, referring to FIG. 7. In FIG. 7, the correlation between the mask 30 and the substrate 53 can be seen. The mask 30 is divided into multiple mask subfields 31A, 31B, 31C, . . . , at respective pitches in the X and Y directions. The mask subfields are separated from one another by struts 32 serving as boundaries. The electron beam EB is illuminated onto an irradiation region 35 within a respective mask subfield (e.g., subfield 31 in FIG. 7). Each mask subfield comprises electron-beam-transmitting portions that correspond with the respective portions of the mask pattern that are to be transferred by that mask subfield. The struts 32 provide physical support for the mask 30.

Representative masks for use with an electron beam include the so-called scattering masks and perforated-stencil masks. A scattering mask comprises, inside each mask subfield, electron-transmitting regions formed of a thin film of, e.g., silicon nitride (SiN). On the surface of such a thin film are electron-scattering regions formed from tungsten or other suitable metal. The electron-scattering regions and the electron-transmitting regions collectively form a respective pattern in each mask subfield. In a perforated-stencil mask, voids are formed in a silicon (Si) diffuser material, the voids serving as the electron-transmitting regions of each mask subfield.

This example embodiment includes an aperture stop 54. If a scattering mask is used, any extraneous scattered electrons will be blocked by the aperture stop 54 and excellent imaging characteristics will be obtained.

The electron beam EB that has passed through the mask subfield 31A is focused on a single transfer subfield 76A on the substrate 53 by the collimation lens 51 and the objective lens 52 in FIG. 6, thereby producing a demagnified projected image of the pattern inside the mask subfield 31A onto the corresponding transfer subfield 76A. During transfer of the entire mask pattern, the electron beam EB sequentially irradiates the mask subfields 31A, 31B, 31C, . . . , so as to sequentially expose the respective transfer subfields 76A, 76B, 76C, . . . , on the substrate 53. By driving the deflectors 50, 55 in FIG. 6 and laterally shifting the electron beam EB by the width of each strut 32 surrounding the mask subfield being irradiated, the transfer subfields 76A, 76B, 76C, . . . , on the substrate 53 are arranged next to one another without any gaps between them.

During operation, the mask stage 66 and the substrate stage 69 are moved in a coordinated manner under the control of the main controller 48. More specifically, the substrate 53 is continuously moved (mechanically scanned) in the +X direction at a velocity $V_W$ in synchrony with the continuous movement of the mask 30 in the −X direction at a velocity $V_M$, as indicated in FIG. 7 (arrows 77W and 77M, respectively). The demagnification ratio of the combination of the collimation lens 51 and objective lens 52 from the mask 30 to the substrate 53 is denoted by β; the width in the X direction of the pattern region inside each mask subfield is denoted by L1; and the gap in the X direction between adjacent pattern regions is denoted by L2. The velocity $V_W$ of the substrate 53 is expressed by:

$$V_W = \beta \cdot [L1/(L1+L2)] \cdot V_M \quad (1)$$

The electron beam EB sequentially irradiates, as appropriately deflected by the subfield-selection deflectors 45, 47, the multiple subfields 31 on the mask 30. The subfields 31 are arranged linearly in multiple rows each extending in the Y direction and each row extending sequentially in the X direction. The rows are sequentially exposed, and the subfields in each row are also sequentially exposed before the next row is moved into position for exposure. For exposure of a particular row, the mask stage 66 is moved until the particular row extends across the optical axis AX (e.g., subfields 31A, 31B, . . . , in FIG. 7). As each row is sequentially selected for exposure (by movement of the mask and substrate stages), each subfield in the row is sequentially exposed (by deflection of the electron beam EB).

The subfields 31 on the mask 30 typically collectively represent a mask "field", i.e., the entire pattern normally representing one "die" 78, to be transferred to a corresponding transfer field on the substrate 53. Completing transfer of all the rows of mask subfields comprising one die produces a corresponding die on the substrate 53. The sequence of events necessary to produce a die 78 on the substrate 53 is normally repeated until the substrate 53 is exposed with the desired number of dies 78.

The shape and other profile characteristics of the crossover image CO are maintained constant in this example embodiment by the imaging-characteristics correction system 60. Thus, for all the mask subfields 31, the portion of the electron beam EB passing through the aperture stop 54 is advantageously constant. This produces a constant brightness and contrast of the image of each die 78 on the substrate 53, despite the need to impart a different amount of deflection of the electron beam EB from the optical axis AX for each mask subfield in each row.

Even in configurations in which an aperture stop 54 is not provided, e.g., in instances in which excitation of the collimation lens 51 and objective lens 52 is constant and the focal-point position of the projected image is dynamically adjusted according to the amount of deflection of the electron beam EB from the optical axis AX required to expose each respective mask subfield 31. The focal-point position of the crossover image CO does not change; as a result, the size of the projected image of each die 78 and the beam intensity at the substrate 53 are also unchanged.

In order to impart the necessary displacement correction of the focal position of the crossover image CO by the imaging-characteristic correction system 60, it is necessary to have accessible certain data concerning the shape and other profile characteristics of each crossover image relative to the distance of the corresponding mask subfield 31 from the optical axis AX. In the following description of a representative method of measuring profile characteristics of the crossover image CO, it will be understood that the shape of the crossover image CO is measured directly at the plane in which the aperture stop 54 is situated (FIG. 6).

Figure 9:
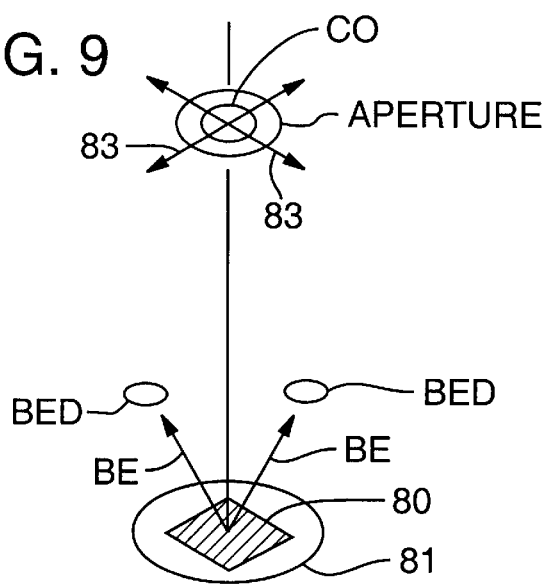
FIG. 9 depicts a reference pattern as used to evaluate beam-displacement correction using the apparatus of Example Embodiment 1.

A reference pattern 80 made from a tantalum (Ta) thin film (that reflects electrons) was formed on a silicon substrate 81, as shown in FIG. 9. The substrate was 81 was then loaded on the substrate stage 69. The reference pattern 80 was made larger than a specified deflection range on the substrate stage 69. The crossover image CO was scanned (arrows 83) on the aperture stop 54 by the deflectors 50. The beam passing through the aperture irradiated the reference pattern 80. Backscattered electrons BE from the reference pattern were detected by backscattered-electron detectors BED. With the mask 30 removed, the irradiation region 35 was set at a position separated, using the subfield-selection deflectors 45, 47 by a specified amount from the optical axis AX.

The main controller 48 received a backscattered-electron signal RE from the backscattered-electron detectors BED synchronously with such scanning, and the backscattered electron signal RE was stored in memory as a function of the displacement.

Figure 10A:
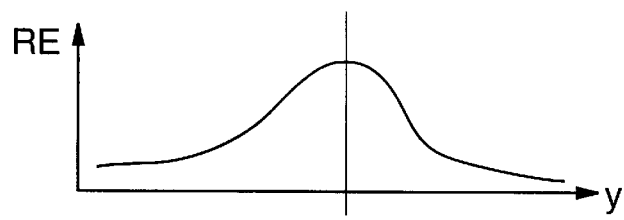
FIG. 10(a) is a plot of the backscattered-electron signal RE as a function of displacement y as obtained during an evaluation of beam-displacement correction of the apparatus of Example Embodiment 1.
Figure 10B:
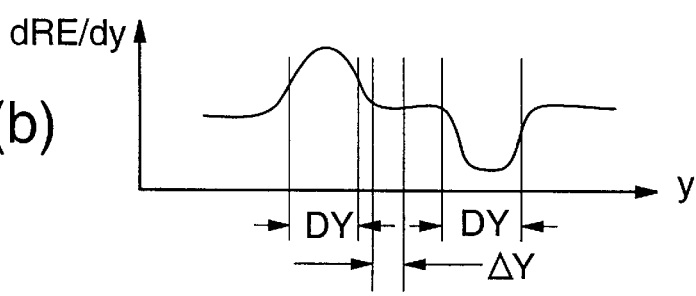
FIG. 10(b) is a plot of the derivative of the FIG. 10(a) plot with respect to y.

FIG. 10(a) shows the backscattered-electron signal RE as a function of the displacement y. By differentiating the backscattered-electron signal RE with respect to the displacement y, a differential signal dRE/dy is obtained, as shown in FIG. 10(b). When the width DY of the signal dRE/dy exceeds a specified threshold, and the displacement ΔY at the center of the signal is determined, the width DY is the width in the Y direction of the crossover image CO, and the displacement ΔY is the amount that the position of the center of the crossover image CO is shifted in the Y direction from the optical axis AX. At the same time, the width in the X direction of the crossover image CO and the amount of its positional shift can also be measured by using X-direction scanning. The shape of the crossover image CO and its position can then be derived from these measurement results. The shape, etc. of the crossover image CO found in this manner is generally stable for several months.

The width DY of the crossover image CO is preferably measured while shifting the focal-point position of the crossover image CO by operating, e.g., the focus-correction coil 60a in the imaging-characteristic correction system 60 in FIG. 6. Thus, the correction amount for the focal-correction coil 60a can be determined because the width DY is narrowest whenever the crossover image CO is at its best-focus position.

Example Embodiment 2

Figure 11:
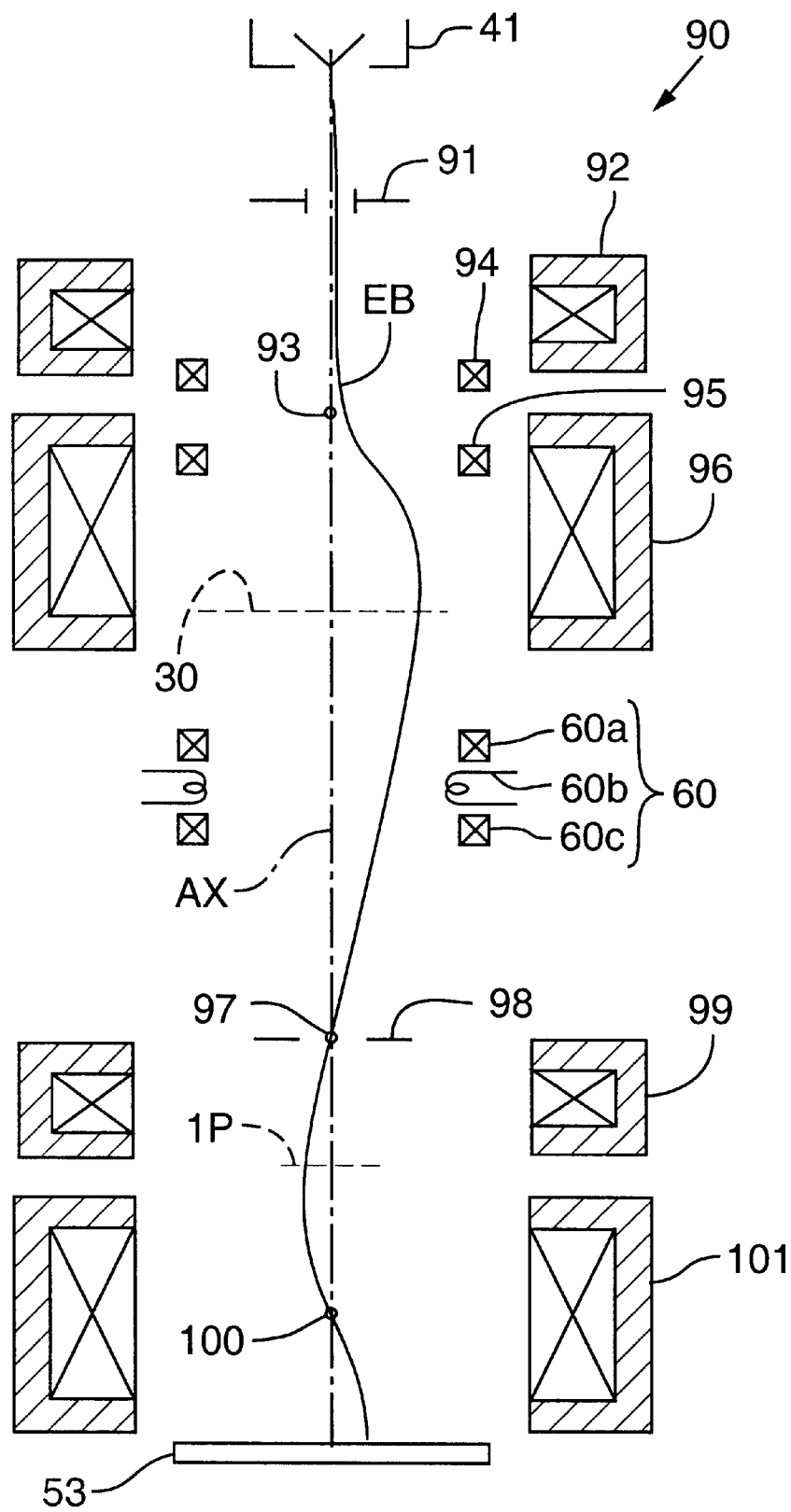
FIG. 11 is a schematic elevational diagram of certain aspects of a charged-particle-beam microlithography apparatus according to Example Embodiment 2.

Certain aspects of this example embodiment are shown in FIG. 11, pertaining to a reducing (i.e., demagnifying) electron-beam microlithography apparatus 90. The apparatus 90 is operable to transfer a pattern defined by a partitioned mask but has a different format from the symmetric magnetic doublet format used as the imaging system in the first example embodiment.

In FIG. 11, an electron beam EB emitted from an electron gun 41 is shaped by an aperture plate 91, and then focused by a first lens 92 to form a first crossover image 93. The electron beam EB before and after the first crossover image 93 is deflected by a first subfield-selection deflector 94 and again by a second field selection deflector 95. The electron beam EB is focused again by a second lens 96 and directed to an irradiation region in a single subfield on the mask 30 by the second lens 96. The mask 30 is situated within the space surrounded by the second lens 96.

The electron beam EB that has passed through the mask 30 is deflected a desired amount by a deflector that is not illustrated (specifically a deflector identical to the deflector 50 in FIG. 6) and a second crossover image 97 is formed. An aperture stop 98 is situated and used as a diffused beam filter at the image-formation plane of the second crossover image 97. A projection lens 99 and demagnification lens form a mask image 1P (i.e., a demagnified image of the pattern inside a single subfield on the mask 30). A third crossover image 100 is formed by a demagnification lens and objective lens 101. Since an inverted and demagnified image of the selected subfield on the mask 30 is formed once by the lenses 96 and 99, and an inverted image is again formed by the lens 101, the image actually formed on the substrate 53 is a positive image of the mask subfield and is formed at a large demagnification ratio.

The embodiment of FIG. 11 also comprises an imaging-characteristic correction system 60 operable to correct the imaging characteristics at the focal-point position of the second crossover image 97. The imaging-characteristics correction system 60 is situated between the mask 30 and the crossover image 97. The imaging-characteristics correction system 60 comprises a focus-correction coil 60a, an astigmatism-correction coil 60b, and an alignment coil 60c. Displacement of the focal-point position as well as correction of astigmatism and positional shift of the second crossover image 97 are achieved by the imaging-characteristics correction system 60. Other structures in this example embodiment are identical to example embodiment 1.

By thus correcting the imaging characteristics of the second crossover image 97, the focal-point position, astigmatism, and positional shift of the second crossover image 97 can be maintained within tolerance regardless of the position of the displacement of the respective mask subfield from the optical axis AX. As a result, the brightness and contrast of the projected image at the substrate 53 is constant over the entire surface of the substrate.

Example Embodiment 3

Figure 12:
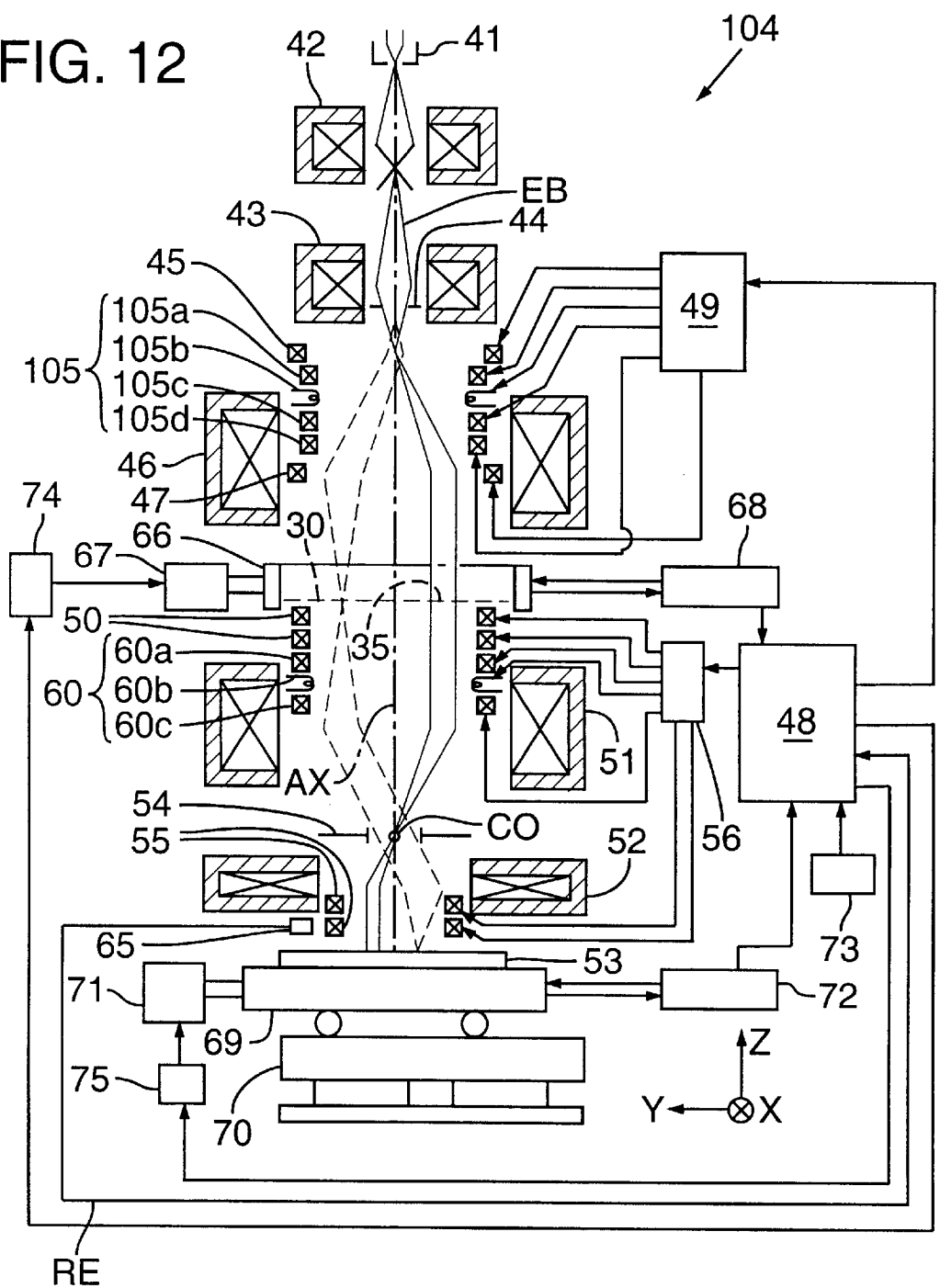
FIG. 12 is a schematic elevational diagram of a charged-particle-beam microlithography apparatus according to Example Embodiment 3.

A reducing (i.e., demagnifying) electron-beam microlithography apparatus 104 according to this example embodiment is shown in FIG. 12. The apparatus 104 comprises an illumination-characteristics correction system 105 for correcting the shape, etc. of the irradiation region 35 on the mask subfield 31. In FIG. 12, components that are the same as shown in FIG. 6 have the same reference designators and are not described further below.

In FIG. 12, the illumination-characteristics correction system 105 is used for correcting such illumination characteristics as shape, position, and irradiation density, etc., of the irradiation region 35 on the mask 30. The illumination-characteristics correction system is situated near the third condenser lens 46. The illumination-characteristics correction system 105 comprises a focus-correction coil 105a to correct any displacement of the focal-point position of the irradiation region 35, an astigmatism-correction coil 105b to correct astigmatism, a deflection-correction coil 105c to correct positional shift, and a rotation-correction coil 105d to correct errors in the rotational angle of the irradiation region 35.

The focus-correction coil 105a is preferably an electromagnetic lens that is identical to the focus-correction coil 60a. The astigmatism-correction coil 105b is preferably an electromagnetic astigmatism compensator identical to the astigmatism-correction coil 60b. The deflection-correction coil 105c is preferably an electromagnetic deflector identical to the alignment coil 60c. The rotation-correction coil 105d is preferably axially extended and preferably lacks a core. The rotation-correction coil 105d is for correction of the rotational angle of the irradiation region 35.

The amounts of correction imparted to the electron beam by the focus-correction coil 105a, the astigmatism-correction coil 105b, the deflection-correction coil 105c, and the rotation-correction coil 105d are preferably set by the main controller 48 for each subfield 31 on the mask 30 by means of the deflection regulator 49. Thus, the illumination characteristics of the irradiation region 35 are maintained constant (within respective tolerances) regardless of the amount of deflection of the electron beam EB from the optical axis AX required to reach a particular mask subfield 31. Also, the shape of the irradiation region 35 is kept constant, regardless of the amount of deflection of the electron beam from the optical axis AX.

Normally, a skirt 34 surrounds the patterned region 33 in each mask subfield 31. The outline of the irradiation region 35 is preferably centered on the skirt 34. In this example embodiment, the skirt 34 can be made smaller to provide a corresponding decrease in the size of the mask 30. As a result, the size of the mask stage 66 can also be decreased, thereby reducing the overall cost of the apparatus 104. In addition, maintaining constancy of the shape of the irradiation region 35 for all mask subfields 31 allows the irradiation density on the substrate 53 to be held constant over the surface of the substrate, thereby eliminating significant variation in the amount of exposure of the substrate 53.

It will be appreciated that the characteristics-correction systems of this example embodiment, along with such systems of other example embodiments described herein, can be applied not only to charged-particle-beam microlithography apparatus employing partitioned masks, but also to cell projection-type microlithography apparatus. Furthermore, these embodiments can be applied not only to electron-beam microlithography apparatus, but also to microlithography apparatus that use ion beams or other charged-particle beams.

In any event, these example embodiments provide the following advantages: (1) Fluctuations in the imaging characteristics of the crossover image can be corrected according to the amount of deflection of the charged-particle beam from the optical axis; i.e., the imaging characteristics of the crossover image is maintained constant regardless of the amount of deflection of the respective mask subfield from the optical axis when sequentially transferring the subfield patterns to the substrate. (2) The pattern size and beam intensity of the projected mask-subfield image is maintained constant even in instances in which, e.g., focal-point-position correction is performed dynamically in the imaging system according to the position of the subfield on the mask. (3) Constant image brightness and contrast is always achieved, especially when a charged-particle-beam-transmitting aperture stop is situated in the vicinity of the crossover-image formation plane centered on the optical axis; the position, etc., of the crossover image does not change with changes in the position of the mask subfield being projected. (4) In cases where variation in the imaging characteristics of the crossover image is attributable to displacement of the focal-point position, astigmatism, and/or positional shift of the crossover image, these imaging parameters can be individually corrected using, e.g., electromagnetic and/or electrostatic compensators. (5) When the imaging-characteristics correction system comprises an electromagnetic or electrostatic compensator, the imaging characteristic of the crossover image can be corrected using a simple structure. (6) The illumination-characteristics correction system corrects variations in the imaging characteristics of the irradiation region of the charged-particle beam on the mask; i.e., the imaging characteristics of the image of the aperture do not change with changes in the amount of deflection of the charged-particle beam from the optical axis. (7) "Useless" areas (i.e., areas contributing no pattern to the substrate) within each mask subfield (such as the skirt) can now be made narrower, thereby permitting the size of the mask to be decreased. (8) The irradiation density of the charged-particle beam is constant over the surface of the substrate, thereby decreasing any variations in exposure on the substrate.

Example Embodiment 4

Figure 13:
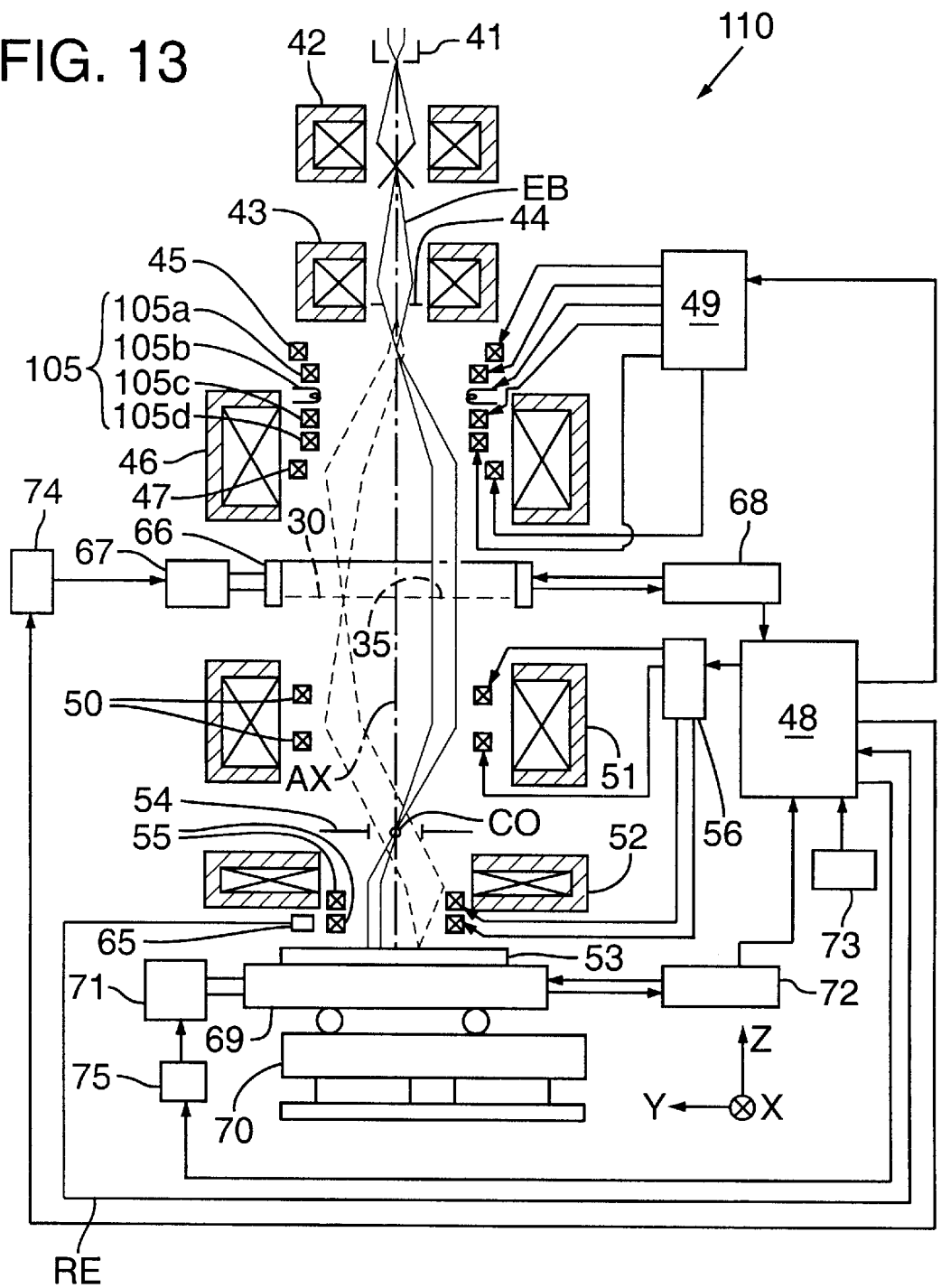
FIG. 13 is a schematic elevational diagram of a charged-particle-beam microlithography apparatus according to Example Embodiment 4.

Certain aspects of a reducing (i.e., demagnifying) electron-beam microlithography apparatus 110 according to this example embodiment are schematically illustrated in FIG. 13. An electron beam EB is produced by an electron gun 41. The electron beam EB is focused a first time by a first condenser lens 42, and a second time by a second condenser lens 43. An aperture plate 44 is situated proximally to the second condenser lens 43. The electron beam EB passes through the aperture of the aperture plate 44 and is deflected essentially in the Y direction by a first subfield-selection deflector 45. The electron beam EB is made into a parallel beam by a third condenser lens 46 and deflected back by a second subfield-selection deflector 47. The electron beam is then directed to the irradiation region 35 of a mask subfield 31 on the mask 30.

Each of the subfield-selection deflectors 45, 47 is preferably an electromagnetic deflector. The amounts of deflection imparted to the beam by the subfield-selection deflectors 45, 47 are predetermined by a main controller 48 (sending signals through a deflection-correction-amount regulator 49) that also controls the overall operation of the apparatus 110. In FIG. 13, the path of the electron beam denoted by the solid lines indicates the conjugate relationship of the crossover, and the path denoted by the dashed lines indicates the conjugate relationship of the mask pattern.

The plane in which the aperture plate 44 is situated is conjugate with the plane of the mask 30. As a result, the projected image of the aperture defined by the aperture plate 44 is the irradiation region 35 on the mask 30.

This embodiment also comprises an illumination-characteristics correction system 105 for correcting the shape, position, and irradiation density, etc., of the irradiation region 35 (FIG. 7). The illumination-characteristics correction system 105 is situated proximally to the third condenser lens 46. The illumination-characteristics correction system 105 comprises a focus-correction coil 105a, an astigmatism-correction coil 105b, a deflection-correction coil 105c, and a rotation-correction coil 105d.

The focus-correction coil 105a is preferably configured as a spiral-wound coil lacking a core. By correcting the focal-point position of the irradiation region 35, the focus-correction coil 105a produces an improved projected image of the opening in the aperture plate 44. Alternatively, such focus correction can be achieved using an electrostatic lens instead of an electromagnetic lens.

Figure 14A:
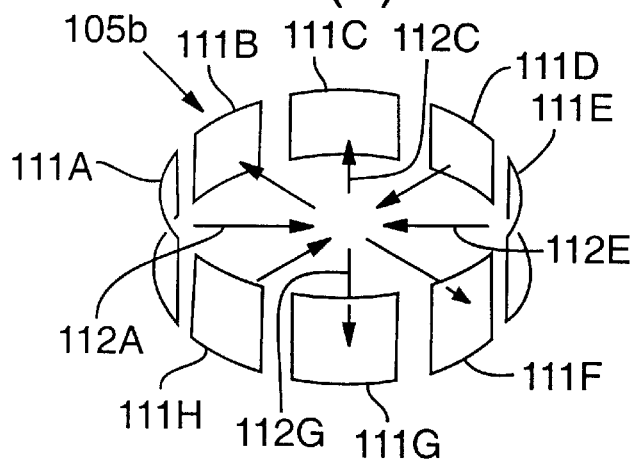
FIG. 14(a) schematically depicts a preferred embodiment of an astigmatism-correction coil as used in the illumination-characteristics-correction system of Example Embodiment 4.

A preferred embodiment of the astigmatism-correction coil 105b is shown in FIG. 14(a), and preferably comprises an octapole configuration comprising eight individual saddle coils 111A–111H. The saddle coils 111A–111H are arranged equiangularly around the optical axis; opposing magnetic fields are generated between each pair of facing coils. E.g., in FIG. 14(a), opposing magnetic fields are generated between facing coils 111A and 111E, as indicated by arrows 112A and 112E, while a magnetic field is generated in the opposite directions between the coils 111C and 111G, as indicated by the arrows 112C and 112G. As an alternative to the electromagnetic configuration described above, the astigmatism-correction coil 105b can have an electrostatic configuration.

Figure 14B:
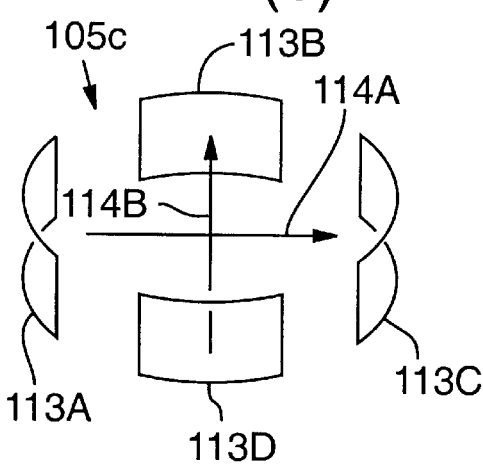
FIG. 14(b) schematically depicts a preferred embodiment of a deflection-correction coil as used in the illumination-characteristics-correction system of Example Embodiment 4.

A preferred embodiment of the deflection-correction coil 105c is shown in FIG. 14(b), and comprises tetrode saddle coils 113A–113D situated equiangularly around the optical axis. Magnetic fields are generated between facing pairs of coils as shown by the arrows 114A, 114B. Thus, the deflection-correction coil 105c corrects the position of the irradiation region 35 in the X direction and in the Y direction. As an alternative to the electromagnetic configuration shown, the deflection-correction coil 105c can comprise an electrostatic deflector.

The rotation-correction coil 105d is preferably a spiral-wound coil lacking a coil. The rotation-correction coil 105d extends in the direction of the optical axis. The rotation-correction coil 105d is operable to correct the rotational angle of the irradiation region 35.

The amounts of correction imparted by the focus-correction coil 105a, the astigmatism-correction coil 105b, the deflection-correction coil 105c, and the rotation-correction coil 105d can be individually set for each mask subfield 31 by the main controller 48 which sends appropriate signals to a deflection-correction regulator 56.

Further with respect to FIG. 13, after passing through the mask 30, the electron beam EB passes through a collimation lens 51 that forms the beam into a crossover CO. As the beam passes through the collimation lens 51, the beam is also deflected a specified amount by deflectors 50 that comprise a two-stage electromagnetic deflector. The beam is focused by an objective lens 52 onto a surface of a substrate (e.g., wafer) 53 coated with an electron-beam resist. An image, demagnified by a specified demagnification ratio $\beta$ (e.g., ¼), of the pattern inside one mask subfield is transferred to the substrate 53. The collimation lens 51 and the objective lens 52 in this example embodiment collectively comprise a symmetric magnetic doublet (SMD)-type imaging system. An aperture stop 54 is situated at the crossover CO.

A deflector 55, preferably having a two-stage electromagnetic configuration, is situated proximally to the objective lens 52 and between the objective lens 52 and the substrate 53. The amount of deflection imparted to the electron beam by the deflectors 50, 55 is determined by the main controller 48 by means of a deflection regulator 56. Since the various subfields 30 on the mask 1 are flanked by struts, the deflectors 50, 55 are used to laterally shift the electron beam, from one exposure to the next, a distance corresponding to the width of a strut. The deflectors 50, 55 are also used to correct synchronization errors between the mask 30 and the substrate 53.

A backscattered-electron detector 65 is situated proximally to the bottom surface of the objective lens 52 and serves to detect electrons from the substrate side. A backscattered-electron signal RE produced by the backscattered-electron detector 65 is routed to the main controller 48.

The mask 30 is mounted on a mask stage 66, parallel with the XY plane. The mask stage 66 is movable continuously in the X direction, and is movable step-wise in the Y direction, as actuated by a driver 67. The position of the mask stage 66 in the XY plane is detected by a laser interferometer 68. Data generated by the laser interferometer 68 is output to the main controller 48.

The substrate 53 is held on a substrate stage 69 on a specimen base 70, parallel with the XY plane. The substrate stage 69 is movable by a driver 71 continuously along the X axis but normally in a direction opposite the direction of motion of the mask stage 66 along the X axis. (Such opposite-direction motion is required because the mask-pattern image is inverted by the lenses 51, 52.) The substrate stage 69 is also movable step-wise in the Y direction. The position of the substrate stage 69 in the XY plane is detected by a laser interferometer 72 which produces data that is output to the main controller 48.

The main controller 48 calculates an appropriate amount of deflection of the electron beam EB to be imparted by the subfield-selection deflectors 45, 47, and by the deflectors 50, 55. The main controller 48 also calculates the information required to control movement of the mask stage 66 and the substrate stage 69 (e.g., the position and movement velocity), based on exposure data entered by an operator using an input device 73 and on positional information regarding the mask stage 66 and substrate stage 69 as detected by the laser interferometers 68, 72, respectively. The results of calculations of the deflection amount are output by the main controller 48 to the deflection regulators 49, 56, which cause the respective deflectors 45, 47 and 50, 55 to achieve the desired amount of deflection.

In addition, by driving the illumination-characteristics correction system 105 (using the deflection-correction regulator 49) according to the amount of deflection of the electron beam EB from the optical axis AX, the transverse profile of the irradiation region 35 on the mask 30 can be maintained constant.

Calculation results regarding movement of the mask stage 66 and substrate stage 69 are output from the main controller 48 to the drivers 74, 75, respectively. The drivers 74, 75 cause respective actuators 67, 71 to operate the stages 66, 69 according to the calculation results.

Figure 15:
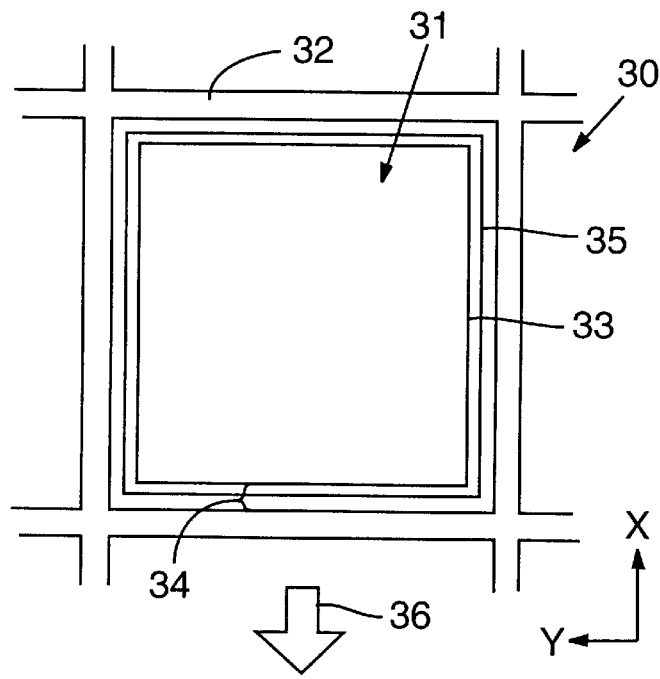
FIG. 15 shows details of a single mask subfield on a task as used with the apparatus of Example Embodiment 4.

The arrangement of subfields on the mask 30 are as shown and discussed above with respect to FIG. 7. FIG. 15 shows a single mask subfield 31 that is representative of any of the subfields 31A, 31B, 31C, . . . , shown in FIG. 7. In FIG. 15, the region 33 encompasses the portion of the mask pattern (including electron-beam-transmitting portions) in the subfield that is to be projected onto the respective transfer subfield on the substrate. The struts 32 block or scatter electrons. The mask 30 can be a scattering mask or a stencil mask.

To transfer the portion of the mask pattern inside the subfield 31 onto the substrate, the electron beam is irradiated onto the irradiation region 35 that encompasses the patterned region 33 of the subfield. In this example, the mask 30 is moved, e.g., in the −X direction as indicated by an arrow 36, by the mask stage 66. Meanwhile, during exposure of each subfield 31, the illumination-characteristics correction system 105 provides appropriate correction of the focal-point position, astigmatism, positional shift, and rotational angle of the beam even whenever the subfield 31 is situated a large lateral distance away from the optical axis AX. Thus, the irradiation region 35 has a consistent transverse profile so as to accurately project an image of the opening in the aperture plate 44 at a specified magnification (e.g., a square with a specified overlap of the patterned region 33. This eliminates the need for surplus in the skirt 34 surrounding the patterned region 33, thereby allowing the overall size of the mask 30 to be made smaller.

Returning to FIG. 7, the electron beam EB that has passed through the mask subfield 31A is focused on a single transfer subfield 76A on the substrate 53 by the collimation lens 51 and objective lens 52. Thus, a demagnified image of the pattern inside the mask subfield 31A is projected onto the corresponding transfer subfield 76A. To complete exposure of a complete die, the electron beam EB sequentially irradiates each of the mask subfields 31A, 31B, 31C, . . . , to produce corresponding exposures on the transfer subfields 76A, 76B, 76C, . . . , on the substrate 53. By driving the deflectors 50, 55 in FIG. 13 and laterally shifting the electron beam EB each time by the width of a strut 32 and skirt 34, the transfer subfields 76 are formed on the substrate 53 next to one another without any gaps between them.

During operation of this example embodiment, the mask stage 66 and the substrate stage 69 are moved as controlled by the main controller 48. The substrate 53 is continuously moved (mechanically scanned) in the +X direction at a velocity $V_W$ synchronously with continuous movement of the mask 30 in the −X direction at a velocity $V_M$. The demagnification ratio of the collimation lens 51 and objective lens 52 is β. Where the width in the X direction of the patterned region 33 is L1, and the gap in the X direction between adjacent patterned regions is L2, the velocity $V_W$ is as stated above in Equation (1). The electron beam EB is sequentially irradiated, by means of the subfield-selection deflectors 45, 47, on the multiple mask subfields as described above in Example Embodiment 1.

Since the transverse profile of the irradiation region 35 is held constant regardless of the amount of beam deflection from the optical axis AX required to reach a particular mask subfield, the skirt 34 inside each mask subfield can be made smaller, thereby allowing the mask 30 to be made smaller. Such size reductions allow a decrease in size of the mask stage 66 with a consequent decrease in manufacturing cost of the apparatus overall. Furthermore, maintaining constancy of the transverse profile of the electron beam yields a constant irradiation density over each irradiation region 35, which eliminates irregularities in exposure amount on the substrate surface.

Since the transverse profile of the irradiation subfield 35 is held constant by the illumination-characteristics correction system 105, as described above, it is advantageous to measure the transverse profile of the irradiation region 35 relative to the lateral displacement of the irradiation region 35 from the optical axis AX. An example method for measuring the transverse profile on the mask 30 is explained below; the example method is performed with the assumption that the collimation lens 51 and the objective lens 52 impart negligible aberration.

Figure 16:
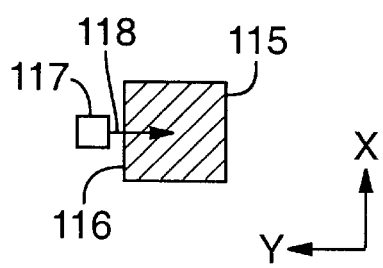
FIG. 16 depicts a reference pattern as used to evaluate beam-displacement correction using the apparatus of Example Embodiment 4.

In the method, a portion of a silicon wafer is used as the substrate 53. A square reference pattern 115 made from a tantalum (Ta) thin film is formed on the wafer, as shown in FIG. 16. With the mask 30 removed from the FIG. 13 apparatus, the irradiation region 35 is displaced from the optical axis AX by the subfield-selection deflectors 451 47. The outline 116 (in the +Y direction) of the reference pattern 115 is moved by driving the substrate stage 69 in the Y direction in a conjugate position with the center of the irradiation region 35. Then, the deflectors 50, 55 are actuated as indicated by the arrow 118 in FIG. 16, so as to scan the image 117 of the irradiation region in the Y direction until the image crosses the edge 116. A backscattered-electron signal RE produced by the backscattered-electron detector 65 is received by the main controller 48 in synchrony with this scanning.

A predetermined conversion coefficient is used to convert the amount of deflection of the image 117 by the deflectors 50, 55 into a displacement y in the Y direction. The backscattered-electron signal RE is stored as a function of the displacement y of the image 117. Also, the origin of the displacement y is located where the amount of deflection by the deflectors 50, 55 is zero.

Figure 17A:
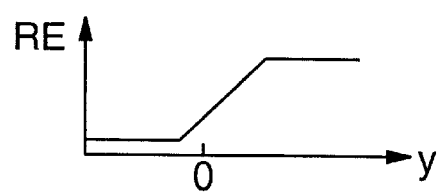
FIG. 17(a) is a plot of the backscattered-electron signal RE as a function of displacement y as obtained during an evaluation of beam-displacement correction of the apparatus of Example Embodiment 4.
Figure 17B:
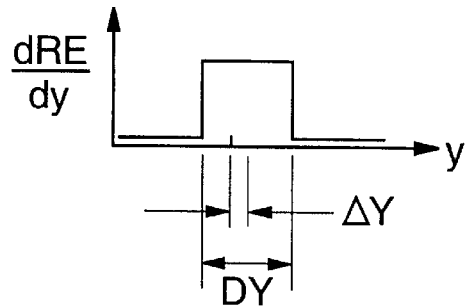
FIG. 17(b) is a plot of the derivative of the FIG. 17(a) plot with respect to y.

FIG. 17(a) is a plot of the backscattered-electron signal RE as a function of the displacement y. By differentiating the backscattered-electron signal RE with respect to the displacement y, a differential signal dRE/dy is obtained that changes depending upon the position, in the Y direction, of the outline of the image 117 of the irradiation field, as shown in FIG. 17(b). When the width DY of the area in which the signal dRE/dy exceeds a specified threshold, and the displacement $\Delta$Y at the center of that area is known, the width DY is the width in the Y direction of the image 117, and the displacement $\Delta$Y is the amount by which the center of the image 117 is shifted in the Y direction from the optical axis AX. Similarly, the width in the X direction of the image 117 and the amount of its positional shift can be measured by using the outline of the reference pattern 115 in the X direction. The shape and position of the irradiation region 35 that is the object of measurement can then be derived from these measurement results and the demagnification ratio $\beta$.

If the signal dRE/dy of the image 117 is measured while shifting the focal-point position of the image 117 (by operating, e.g., the focus-correction coil 105a), the correction amount for the focus-correction coil 105a can be determined because the rise and fall of the waveform (FIG. 17(b)) is sharpest when the irradiation region 35 is at its best-focus position. Similarly, if the signal dRE/dy of the image 117 is measured while shifting the rotational angle of the image 117 (by operating, e.g., the rotation-correction coil 105d), then the correction amount for the rotation-correction coil 105a can be determined because the rise and fall of the waveform (FIG. 17(b)) is sharpest when the outline of the image 117 is parallel to the outline of the reference pattern 115.

Example Embodiment 5

Figure 18:
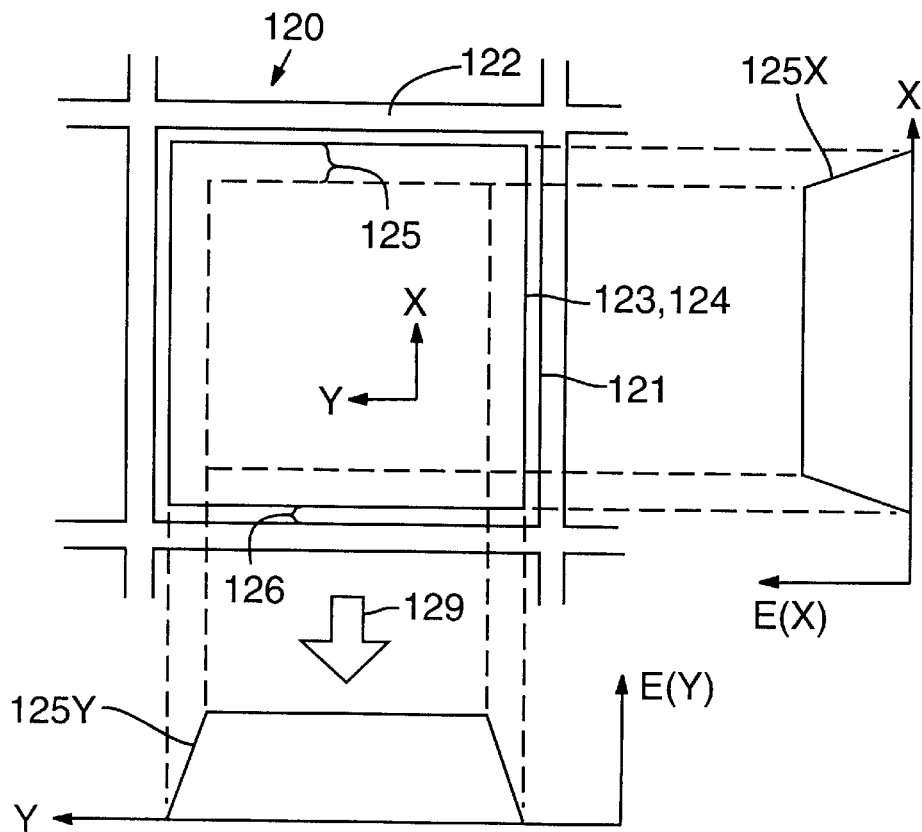
FIG. 18 shows certain details of a representative mask as used with the apparatus of Example Embodiment 5.
Figure 19:
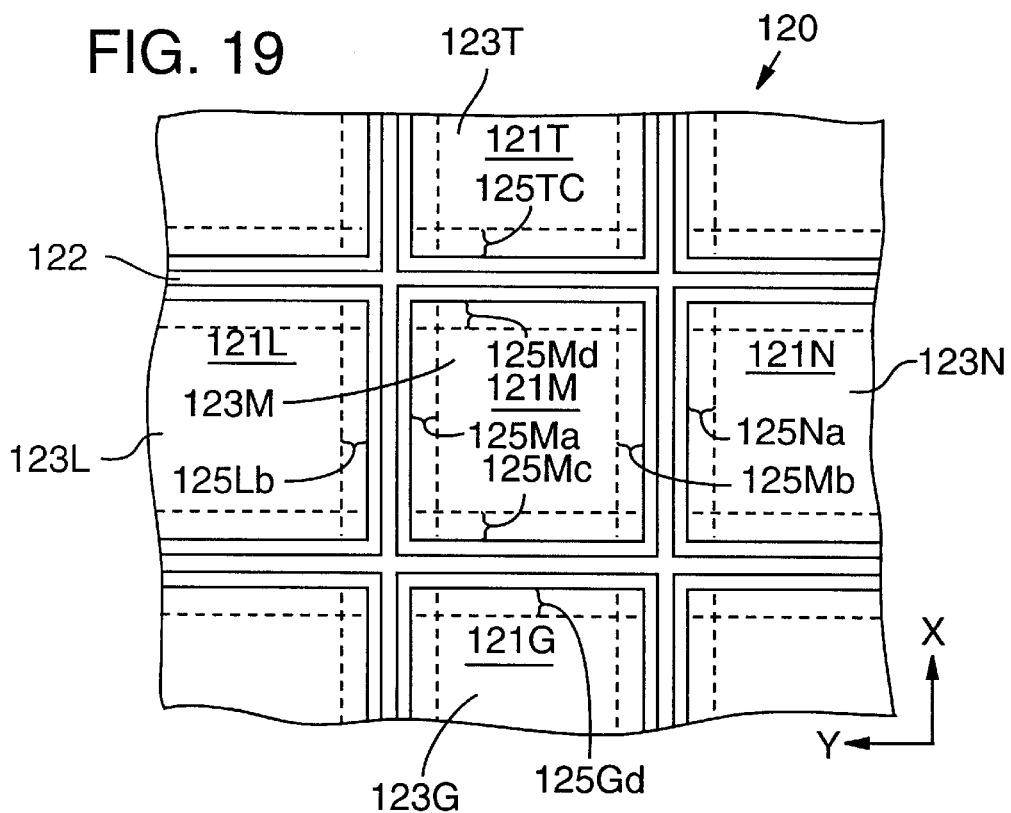
FIG. 19 shows the arrangement of half-shadow regions relative to patterned regions in mask subfields of a mask as used with an apparatus according to Example Embodiment 5.
Figure 20:
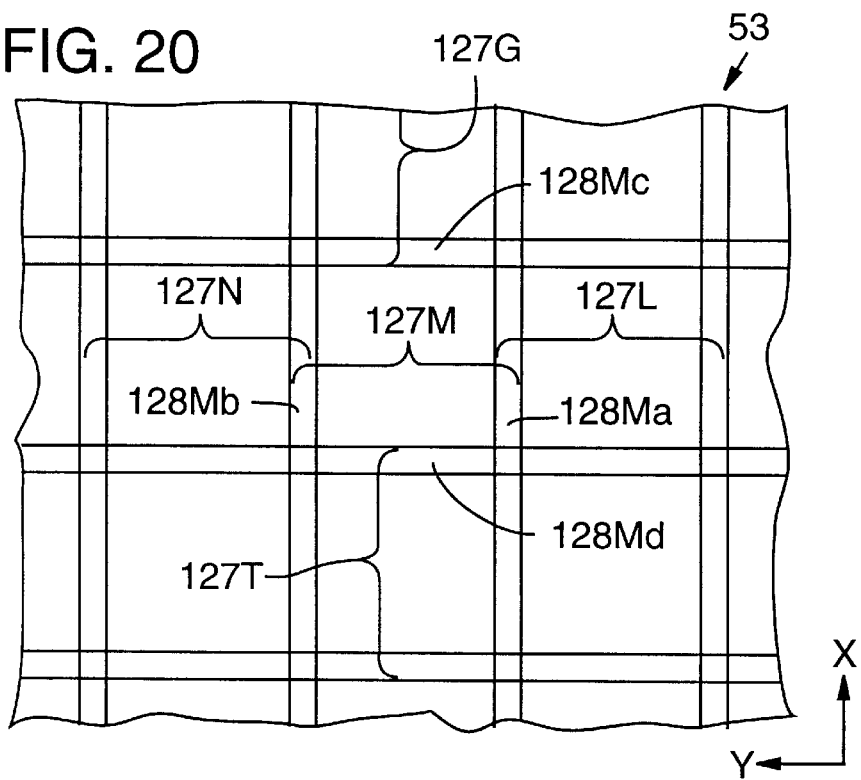
FIG. 20 shows the arrangement of overlay regions relative to transfer subfields on an exposed substrate using the mask of FIG. 19 and an apparatus according to Example Embodiment 5.

This example embodiment is illustrated in FIG. 18, FIG. 19, and FIG. 20, as used with a partitioned mask and "half-shadow overlay" transfer of the mask pattern to the substrate. The overall apparatus is similar to that shown in FIG. 13, except that the aperture plate 44 is situated in a plane that is displaced ("defocused") a specified amount from the plane conjugate with the mask 30. Furthermore, the mask-pattern arrangement and transfer method are different. The major differences will be described below.

FIG. 18 shows a representative mask 120 used with this example embodiment. The mask 120 is partitioned into multiple subfields 121 at specified pitches in the X and Y directions by flanking struts 122 and skirt 126. With respect to each subfield 121, the respective portion of the mask pattern is situated inside the patterned region 123 inside the actual subfield 121. In the "half-shadow overlay" method to which this example embodiment is directed, the image of the opening in the aperture plate 44 in FIG. 13 is projected onto an irradiation region 124 having the same size and shape as the patterned region 123. In other words, the outline of the patterned region 123 is essentially established by the irradiation region 124. The intensity distribution of the electron beam decreases in a linear (or nearly linear) fashion in a region termed the "half-shadow region" 125 having a specified width and extending inwardly from the boundary of the irradiation region 124. The intensity of the beam becomes 0 [zero] at the boundary of the irradiation region 124.

FIG. 18 also shows the intensity distribution E(Y) in the Y direction at the center of the irradiation region 124 and the intensity distribution E(X) in the X direction at the center of the irradiation region 124. The intensity distributions E(X), E(Y) of the electron beam decrease in a linear (or nearly linear) fashion in regions 125X, 125Y corresponding to the respective half-shadow regions 125, thereby forming a trapezoidal (or nearly trapezoidal) distribution of irradiation energy. As an example, if the patterned region 123 has an area of (1 mm)$^2$, then the width of the half-shadow region 125 is 0.01 to 0.1 mm.

In FIG. 18, the mask 120 is moved in, e.g., the -X direction as indicated by the arrow 129. The irradiation region 124 is "moved" in the -X direction by the subfield-selection deflectors 45, 47 (FIG. 13). In addition, the shape, position, and irradiation density, etc. of the irradiation region 124 are held constant in this example embodiment by the illumination-characteristics correction system 105 (FIG. 13) regardless of the amount of deflection of the electron beam from the optical axis AX required for the beam to reach any particular subfield on the mask 30. Since the patterned region 123 or irradiation region 124 can extend to nearly the entire breadth of the subfield 121, and since a region 126 between the patterned region 123 and the strut 122 (also referred to as the "skirt") can be made sufficiently narrow as to be nearly negligible, the mask 120 can be made smaller.

The half-shadow region 125 of the patterned region 123 can overlap the half-shadow region of the adjacent subfield. Such overlapping is shown in FIG. 19 which shows several mask subfields 121G, 121L–121N, 121T. The half-shadow regions 125Ma, 125Mb, 125Md, 125Mc are situated left and right, above and below, respectively, the patterned region 123 inside the subfield 121M. In the subfield 121M, the pattern formed in the half-shadow region 125Ma on the left side (+Y direction) of the patterned region 123M is identical to the pattern formed in the half-shadow region 125Lb on the right side of the patterned region 123L of the mask subfield 121L adjacently left. Similarly, an identical pattern is formed in the half-shadow region 125Mb and in the half-shadow region 125Na, an identical pattern is formed in the half-shadow regions 125Md and 125Tc, and an identical pattern is formed in the half-shadow regions 125Mc and 125Gd.

When the subfields in FIG. 19 are transferred to the substrate 53, the patterns in the patterned regions 123L–123N, 123T, 123G are transferred to the transfer subfields 127L–127N, 127T, 127G, respectively, on the substrate 53 in FIG. 20. The transfer subfields 127L–127N, 127T, 127G are preferably arranged so that the patterns in adjacent half-shadow regions (125Ma, etc.) in FIG. 19 overlap one another on the substrate 53. An example is the transfer subfield 127M corresponding to the mask subfield 121 in FIG. 19. The patterns in the half-shadow regions 125Ma, 125Lb are transferred overlapping one another in an overlay region 128Ma of a specified width on the right side of the transfer subfield 127M in FIG. 20, while the patterns in the half-shadow regions 125Mb, 125Na are transferred overlapping one another in an overlay region 128Mb on the left side. Similarly, the patterns in the half-shadow regions 125Mc, 125Gd and in half-shadow regions 125Md, 125Tc are transferred overlapping one another in the overlay regions 128Mc and 128Md, respectively, at the top and bottom of the transfer subfield 127N in FIG. 20.

Since the patterned regions on the mask that correspond with the respective overlay regions in the various transfer subfields 127L, 127N, . . . , are thus transferred overlapping one another on the substrate 53, "stitching errors" are decreased compared to situations in which there are no overlays. Moreover, since the intensity of the irradiation region 124 on the mask 120 decreases in a linear (or nearly linear) fashion in the half-shadow regions, as shown in FIG. 18, the net exposure in the overlay regions is identical to the amount of exposure in other exposed regions on the substrate 53. This avoids irregularities in exposure amounts over the surface of the substrate.

Since the profile of the irradiation regions 124 is the same, "seams" between the transfer subfields on the substrate 53 lack irregularities and the desired mask pattern is produced on each die with high accuracy. In addition, the electron-beam intensity distribution inside the patterned region 123 in each subfield is always the same; this ensures that pattern transfer is accomplished at high resolution.

It will be apparent that this example embodiment can be used not only with an electron beam, but also with other types of charged particle beams such as an ion beam.

Therefore, Example Embodiments 4 and 5 provide the following: (1) Illumination-characteristics correction of the charged-particle beam is provided to correct variations in the intensity distribution of radiation on each mask subfield, regardless of the amount of deflection of the beam relative to the optical axis in order to reach any mask subfield. (2) The illumination characteristics (e.g., transverse profile) of the charged-particle beam used to illuminate the mask subfields are kept constant regardless of the amount by which the beam deflects from the optical axis to reach any mask subfield. (3) The skirt in each mask subfield can be made narrower, enabling the mask and the mask stage to be made smaller. (4) Incomplete transfer of mask subfields and exposure irregularities are avoided. (5) The illumination characteristics that are corrected include one or more of focal-point position, astigmatism, rotational error, and positional error of the aperture image; these characteristics are selectively corrected using respective electromagnetic or electrostatic deflectors. (6) In cases where the transverse intensity distribution of the charged-particle beam decreases monotonically toward the outside, and the pattern image inside the subfield has an outline that overlaps adjacent patterns on the substrate, transfer can be performed using half-shadow overlay. In such cases, seams between adjacent transfer subfields are smooth with minimal irregularities in exposure over the substrate surface. (7) By performing correction of illumination characteristics using electromagnetic compensators or electrostatic compensators, such corrections are performed using simple structures.

Whereas the invention has been described in connection with multiple example embodiments, it will be understood that the invention is not limited to those embodiments. On the contrary, the invention is intended to encompass all alternatives, modifications, and equivalents as may be included within the spirit and scope of the invention as defined by the appended claims.

What is claimed is:

1. A charged-particle-beam microlithography apparatus for transferring a pattern defined by a mask onto a sensitive substrate, the mask being partitioned into multiple mask subfields each defining a portion of the pattern, the apparatus comprising:
   (a) a charged-particle-beam illumination system comprising a lens and a subfield-selection deflector for selectively directing a charged-particle beam from a charged-particle beam source to a desired mask subfield so as to sequentially expose the mask subfields with the charged-particle beam;
   (b) a charged-particle-beam projection system situated downstream along an optical axis from the charged-particle-beam illumination system, the charged-particle-beam projection system being for receiving a portion of the charged-particle beam passing through the selected mask subfield; and
   (c) a beam-characteristics correction system situated between the source and the substrate, the beam-characteristics correction system serving to dynamically correct any variations arising in a transverse parameter of the charged-particle beam as the charged-particle beam exposes different transfer subfields on the substrate with respective mask subfields, so that the transverse parameter of the charged-particle beam remains unchanged regardless of an amount of deflection of the charged-particle beam from the optical axis required to reach the selected mask subfield relative to any other mask subfield.

2. The apparatus of claim 1, wherein the beam-characteristics correction system comprises a first set of coils situated between the source and the mask to correct variations in the transverse parameter arising in the charged-particle-beam illumination system.

3. The apparatus of claim 2, wherein the beam-characteristics correction system further comprises a second set of coils situated between the mask and the substrate, the second set of coils being energizable to dynamically correct any variations arising, in the charged-particle-beam projection system, in the transverse parameter of the charged-particle beam as the charged-particle beam exposes different transfer subfields on the substrate with respective mask subfields, so that the transverse parameter remains unchanged regardless of an amount of deflection of the charged-particle beam from the optical axis required to reach the selected transfer subfield relative to any other transfer subfield.

4. The apparatus of claim 3, wherein the transverse parameter corrected by the second set of coils is at least one of focus, astigmatism, position relative to the optical axis, transverse shape, rotation, and irradiation density of the charged-particle beam.

5. The apparatus of claim 4, wherein the second set of coils comprises a coil to correct focal-point displacement, a coil to correct astigmatism, a coil to correct positional alignment, and a coil to correct rotation of the charged-particle beam.

6. The apparatus of claim 2, wherein the transverse parameter is at least one of focus, astigmatism, position relative to the optical axis, transverse shape, rotation, and irradiation density of the charged-particle beam.

7. The apparatus of claim 6, wherein the first set of coils comprises a coil to correct focal-point displacement, a coil to correct astigmatism, a coil to correct positional alignment, and a coil to correct rotation of the charged-particle beam.

8. The apparatus of claim 7, wherein the coil to correct focal-point displacement comprises an electromagnetic coil lacking a core.

9. The apparatus of claim 7, wherein the coil to correct astigmatism comprises at least eight electromagnetic coils arranged equiangularly around the optical axis, wherein opposing magnetic fields are generated between opposing pairs of the saddle coils.

10. The apparatus of claim 7, wherein the coil to correct positional alignment comprises at least four electromagnetic coils arranged equiangularly around the optical axis, wherein same-directional magnetic fields are generated between opposing pairs of the saddle coils.

11. The apparatus of claim 2, further comprising a crossover located on the optical axis at which a crossover image is formed by the charged-particle-beam projection system of the charged-particle-beam source as irradiated through the selected mask subfied, the first set of coils correcting any variations in the transverse parameter at the crossover.

12. The apparatus of claim 11, further comprising an aperture stop situated at the crossover, the aperture defining an axial aperture that transmits the crossover image.

13. The apparatus of claim 2, wherein the first set of coils comprises at least one of an electromagnetic compensator coil and an electrostatic compensator coil.

14. The apparatus of claim 2, further comprising an aperture plate situated between the charged-particle-beam source and the mask, the aperture plate defining an aperture dimensioned to shape the charged-particle beam for forming an irradiation region on the selected mask subfield, the first set of coils maintaining a profile of the irradiation region constant regardless of the amount of deflection of the charged-particle beam from the optical axis for the charged-particle beam to reach any selected mask subfield.

15. The apparatus of claim 14, wherein the aperture plate is coplanar with a plane that is conjugate with the mask.

16. The apparatus of claim 14, wherein the aperture plate is displaced from a plane that is conjugate with the mask.

17. The apparatus of claim 16, wherein the irradiation region has a border and an intensity distribution that is constant in central regions of the irradiation region and that decreases to zero linearly across the border to define a trapezoidal distribution of irradiation energy across the irradiation region.

18. The apparatus of claim 17, wherein regions of the irradiation region exhibiting a linear decrease of irradiation energy define half-shadow regions.

19. The apparatus of claim 18, wherein the charged-particle-beam projection system projects successive mask subfields on the substrate such that, with respect to corresponding transfer subfields, the half-shadow region of each transfer subfield overlaps the half-shadow region of an adjacent transfer subfield.

20. The apparatus of claim 14, wherein the first set of coils maintain the profile of the irradiation region constant by correcting at least one of focus, astigmatism, position relative to the optical axis, and irradiation density of the charged-particle beam.

21. The apparatus of claim 2, wherein the charged-particle beam projection system comprises a collimation lens, an objective lens, and a deflector for directing the charged-particle beam from the selected mask subfield to a crossover, and from the crossover to a corresponding transfer subfield on the substrate.

22. The apparatus of claim 1, wherein the beam-characteristics correction system comprises a first set of coils situated between the mask and the substrate to correct variations in the transverse parameter arising in the charged-particle-beam projection system.

23. The apparatus of claim 22, wherein the transverse parameter is at least one of focus, astigmatism, position relative to the optical axis, transverse shape, rotation, and irradiation density of the charged-particle beam.

24. The apparatus of claim 23, wherein the first set of coils comprises a coil to correct focal-point displacement, a coil to correct astigmatism, and a coil to correct positional alignment of the charged-particle beam.

25. The apparatus of claim 1, wherein the beam-characteristics correction system comprises at least one of an electromagnetic compensator coil and an electrostatic compensator coil.

26. The apparatus of claim 1, further comprising a main controller connected to the beam-characteristics correction system via a deflection-correction regulator and connected to the subfield-selection deflector and the deflector in the charged-particle-beam projection system, the main controller determining an amount of required deflection of the charged-particle beam by the subfied-selection deflector and the deflector in the charged-particle-beam projection system and determining an amount of dynamic correction required of the transverse parameter by the beam-characteristics correction system, depending upon the particular mask subfield being exposed.

* * * * *

UNITED STATES PATENT AND TRADEMARK OFFICE
CERTIFICATE OF CORRECTION

PATENT NO. : 5,912,469

DATED : June 15, 1999

INVENTOR(S) :
Teruaki Okino

It is certified that error appears in the above-identified patent and that said Letters Patent is hereby corrected as shown below:

Column 18, line 50, "deflectors 451 47" should be --deflectors 45, 47--.

In the Claims:

Column 22, line 63, claim 11, "subfied" should be --subfield--.

Column 23, line 26, claim 19, "apparat us" should be --apparatus--.

Column 24, line 29, claim 26, "subfied" should be --subfield--.

Signed and Sealed this

Twenty-eighth Day of November, 2000

Attest:

Q. TODD DICKINSON

*Attesting Officer*      *Director of Patents and Trademarks*